US 8,743,541 B2

(12) United States Patent
Hata et al.

(10) Patent No.: US 8,743,541 B2
(45) Date of Patent: Jun. 3, 2014

(54) DISPLAY DEVICE AND ELECTRONIC DEVICE

(75) Inventors: Yukihiko Hata, Hamura (JP); Yasuyuki Horii, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 13/309,234

(22) Filed: Dec. 1, 2011

(65) Prior Publication Data
US 2012/0229978 A1    Sep. 13, 2012

(30) Foreign Application Priority Data

Mar. 8, 2011   (JP) ................................ 2011-050473

(51) Int. Cl.
  *H05K 7/20*   (2006.01)
  *F28F 7/00*   (2006.01)
  *H01B 9/06*   (2006.01)

(52) U.S. Cl.
  USPC . 361/695; 361/694; 361/679.47; 361/679.48; 361/679.52; 361/700; 165/80.4; 174/16.1; 174/16.3; 174/15.1; 174/15.2

(58) Field of Classification Search
  None
  See application file for complete search history.

(56) References Cited

U.S. PATENT DOCUMENTS

| | | | |
|---|---|---|---|
| 6,657,860 B2 | 12/2003 | Matsui et al. | |
| 6,900,990 B2 * | 5/2005 | Tomioka | 361/752 |
| 6,992,884 B2 | 1/2006 | Minaguchi et al. | |
| 7,164,577 B2 | 1/2007 | Minaguchi et al. | |
| 7,310,227 B2 * | 12/2007 | Kusamoto et al. | 361/695 |
| 7,649,736 B2 * | 1/2010 | Hongo | 361/679.47 |
| 7,660,119 B2 * | 2/2010 | Iikubo | 361/697 |
| 7,760,496 B2 * | 7/2010 | Tsukazawa | 361/679.48 |
| 7,830,663 B2 * | 11/2010 | Iikubo | 361/697 |
| 8,031,469 B2 * | 10/2011 | Tomioka et al. | 361/700 |
| 8,107,239 B2 * | 1/2012 | Fujiwara | 361/695 |
| 8,238,100 B2 * | 8/2012 | Fujiwara | 361/695 |

(Continued)

FOREIGN PATENT DOCUMENTS

| | | |
|---|---|---|
| JP | S58-101226 U | 7/1983 |
| JP | H03-98480 U | 10/1991 |

(Continued)

OTHER PUBLICATIONS

Office Action Received in Japanese Patent Application No. 2011-050473, mailed on Mar. 21, 2012; in 8 pages.

(Continued)

*Primary Examiner* — Boris Chervinsky
(74) *Attorney, Agent, or Firm* — Knobbe, Martens, Olson & Bear LLP

(57) ABSTRACT

According to one embodiment, a display device includes a housing, a circuit board device, a fan, and a wall portion. The housing includes an exhaust port. The circuit board device is housed in the housing. The fan includes an ejection port and is housed in the housing at a position separated from the exhaust port. The fan sends cooling wind to between the circuit board device and the inner surface of the housing. The wall portion is located between the inner surface of the housing and the circuit board device, and constitutes a ventilation path from the ejection port to the exhaust port. The wall portion includes a first member located in the inner surface of the housing and a second member attached to the first member and abutting on the circuit board device. The second member has a rigidity lower than the rigidity of the first member.

12 Claims, 22 Drawing Sheets

(56) References Cited

U.S. PATENT DOCUMENTS

| | | | |
|---|---|---|---|
| 8,508,939 B2* | 8/2013 | Takahasi et al. | 361/695 |
| 2003/0016497 A1 | 1/2003 | Matsui et al. | |
| 2004/0240165 A1 | 12/2004 | Minaguchi et al. | |
| 2005/0111202 A1 | 5/2005 | Minaguchi et al. | |
| 2006/0232934 A1 | 10/2006 | Kusamoto et al. | |
| 2008/0019093 A1* | 1/2008 | Hongo | 361/693 |
| 2012/0075787 A1* | 3/2012 | MacDonald | 361/679.5 |

FOREIGN PATENT DOCUMENTS

| | | |
|---|---|---|
| JP | H09-218724 | 8/1997 |
| JP | H10-150284 | 6/1998 |
| JP | 10-303580 | 11/1998 |
| JP | 2003-046046 | 2/2003 |
| JP | 2004-233792 | 8/2004 |
| JP | 2005-157790 | 6/2005 |
| JP | 2006-301715 | 11/2006 |
| JP | 2006-301715 A1 | 11/2006 |
| JP | 2009-014764 | 1/2009 |
| JP | 2011-003204 | 1/2011 |

OTHER PUBLICATIONS

Office Action Received in Japanese Patent Application No. 2011-050473, mailed on Jul. 10, 2012; in 5 pages.
Office Action received in Japanese Patent Application No. 2012-266907, mailed on Jul. 30, 2013; in 6 pages.

* cited by examiner

DISPLAY DEVICE AND ELECTRONIC DEVICE

CROSS-REFERENCE TO RELATED APPLICATIONS

This application is based upon and claims the benefit of priority from Japanese Patent Application No. 2011-050473, filed Mar. 8, 2011, the entire contents of which are incorporated herein by reference.

FIELD

Embodiments described herein relate generally to a display device provided with a cooling fan and an electronic device.

BACKGROUND

Some display devices and electronic devices are provided with a cooling fan that cools a cooling target component mounted on a circuit board.

Recently, such display devices and electronic devices are required to suppress an increase in load on the circuit board as well as to improve cooling efficiency achieved by the cooling fan.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a display device comprises a housing, a circuit board device, a fan, and a wall portion. The housing comprises an exhaust port. The circuit board device is housed in the housing. The fan comprises an ejection port and is housed in the housing at a position separated from the exhaust port. The fan is configured to send cooling wind to between the circuit board device and the inner surface of the housing from the ejection port. The wall portion is located between the inner surface of the housing and the circuit board device, and constitutes a ventilation path from the ejection port to the exhaust port. The wall portion comprises a first member located in the inner surface of the housing, and a second member attached to the first member and abutting on the circuit board device. The second member has a rigidity lower than the rigidity of the first member.

Exemplary embodiments will be described in detail below with reference to the accompanying drawings. The embodiments will be described by way of example as being applied to a notebook personal computer (PC) or a television.

FIGS. 1 to 21 illustrate an electronic device 1 according to a first embodiment. The electronic device 1 may be, for example, a notebook PC. The electronic device 1 is not limited to a notebook PC but may be any other electronic device including, for example, a display device such as a television, a video recorder, a personal digital assistant (PDA), or a game machine.

Figure 1:
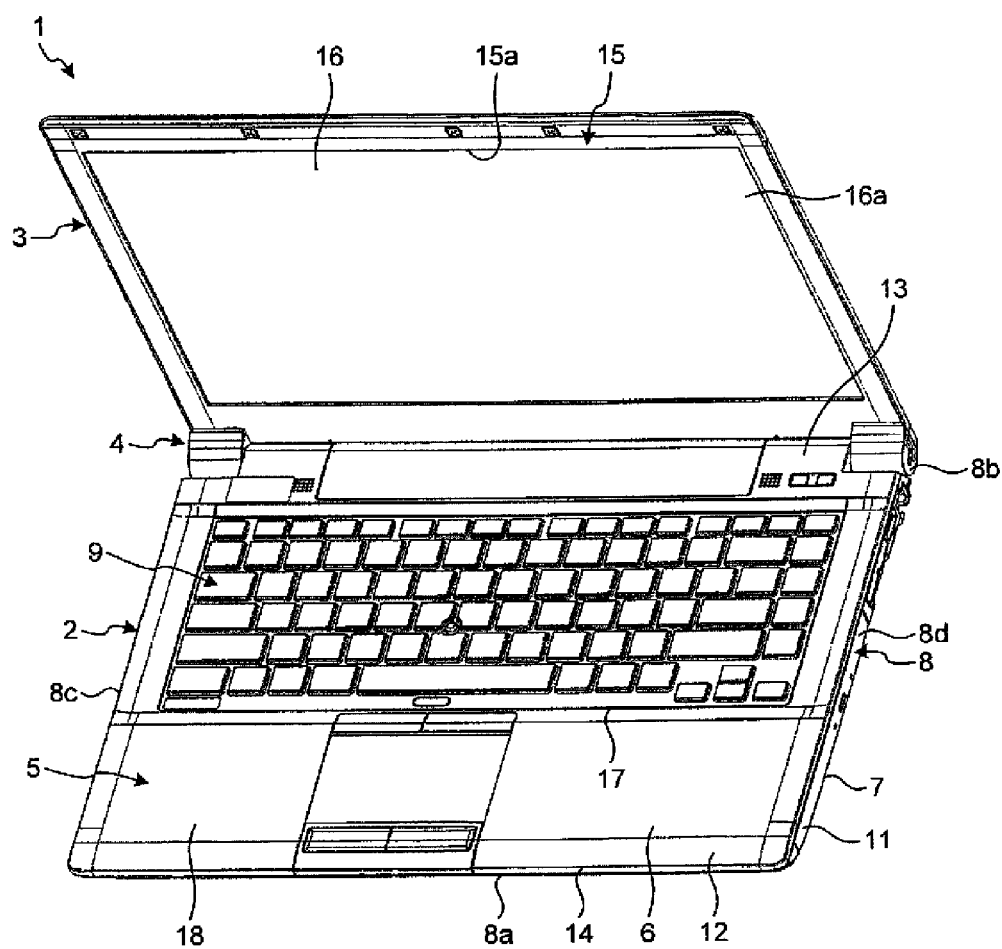
FIG. 1 is an exemplary perspective view of an electronic device according to a first embodiment.

As illustrated in FIG. 1, the electronic device 1 comprises a main body 2, a display module 3, and a hinge 4. The main body 2 has a main board mounted thereon. The main body 2 comprises a housing 5. The housing 5 comprises an upper wall 6, a lower wall 7, and a peripheral wall 8 and is formed into a flat box-like shape.

When the electronic device 1 is placed on a desk, the lower wall 7 faces the upper surface of the desk in substantially parallel thereto. The upper wall 6 lies substantially in parallel to (i.e., substantially horizontal to) the lower wall 7 with a space therebetween. A keyboard 9 is attached to the upper wall 6. The peripheral wall 8 extends vertically from the lower wall 7 to connect a rim of the lower wall 7 and a rim of the upper wall 6.

The housing 5 comprises a base 11 and a cover 12. The base 11 includes the lower wall 7 and part of the peripheral wall 8. The cover 12 includes the upper wall 6 and part of the peripheral wall 8. The cover 12 is combined with the base 11 to form the housing 5.

The housing 5 comprises a rear end 13 (first end) and a front end 14 (second end) located opposite the rear end 13. The display module 3 is rotatably connected to the rear end 13. The peripheral wall 8 comprises a front wall 8a, a rear wall 8b, a left sidewall 8c, and a right sidewall 8d. The front wall 8a extends in the width direction (horizontal direction) of the housing 5 at the front end 14. The rear wall 8b extends in the width direction of the housing 5 at the rear end 13. The left sidewall 8c and the right sidewall 8d extend in the depth direction (front-back direction) of the housing 5 to connect ends of the front wall 8a and the rear wall 8b.

The display module 3 is connected to the rear end 13 of the main body 2 by the hinge 4 to be rotatable between open and closed positions. The display module 3 is rotatable between the closed position where the display module 3 lies as covering the main body 2 from above and the opened position where the display module 3 is raised from the main body 2.

As illustrated in FIG. 1, the display module 3 comprises a display housing 15 and a display panel 16 housed in the display housing 15. A display screen 16a of the display panel 16 can be exposed to the outside through an opening 15a provided in the front wall of the display housing 15.

Figure 10:
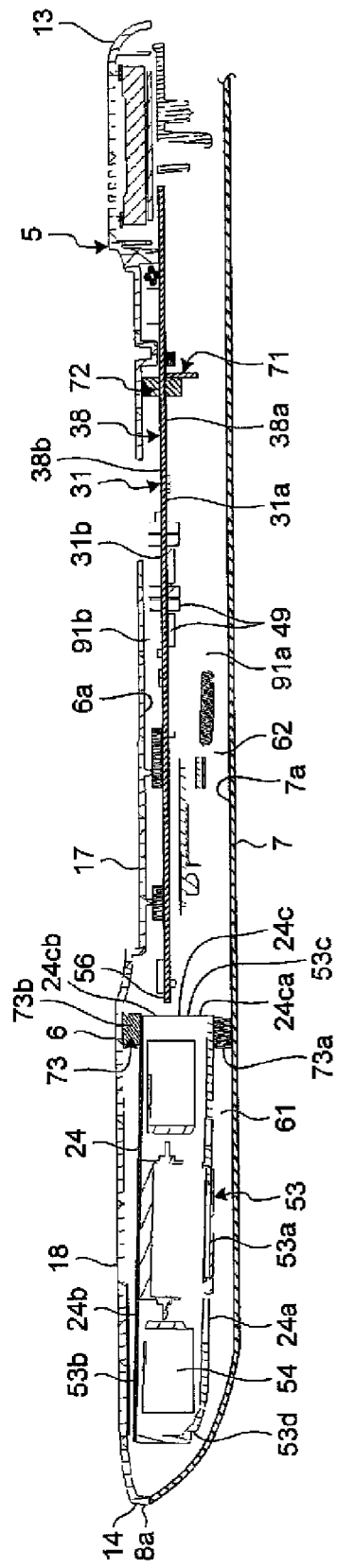
FIG. 10 is an exemplary cross-sectional view taken along line F10-F10 of FIG. 8 in the first embodiment.

As illustrated in FIG. 1, the upper wall 6 comprises a keyboard placing portion 17 to which the keyboard 9 is attached and a palm rest 18. The palm rest 18 is provided in front of the keyboard placing portion 17, i.e., between the keyboard placing portion 17 and the front wall 8a. As illustrated in FIG. 10, the keyboard placing portion 17 is recessed in the housing 5 with respect to the palm rest 18. Therefore, the upper surface of the keyboard 9 attached to the keyboard placing portion 17 is substantially at the same level as or slightly higher than the upper surface of the palm rest 18.

Figure 2:
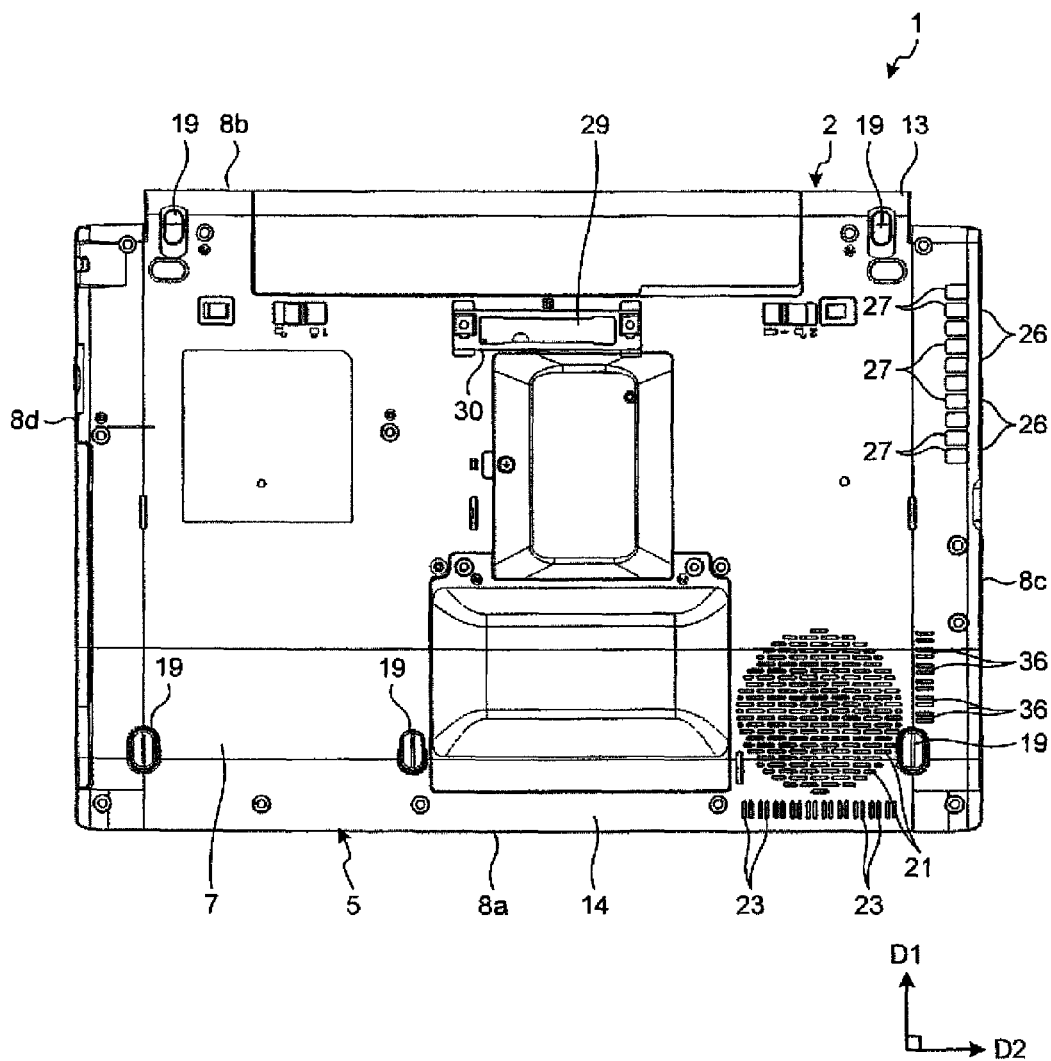
FIG. 2 is an exemplary plan view illustrating a lower wall of the electronic device of FIG. 1 in the first embodiment.
Figure 3:
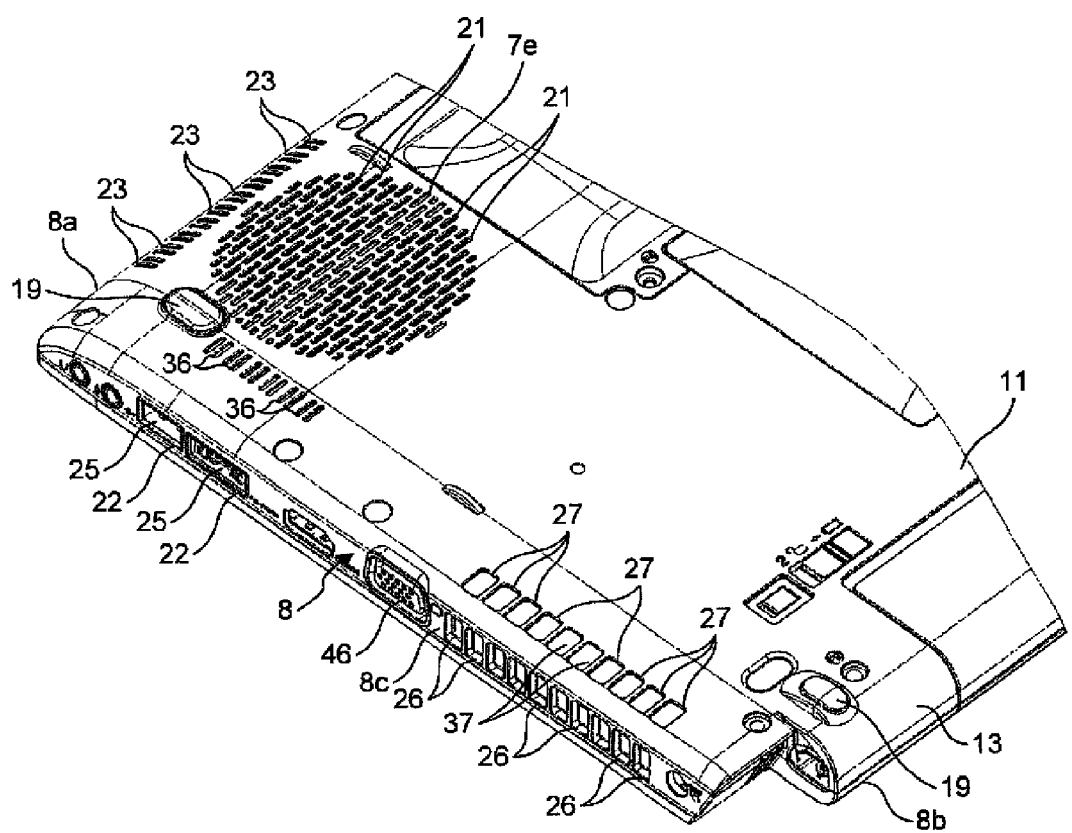
FIG. 3 is an exemplary perspective view illustrating the lower wall and a peripheral wall of the electronic device of FIG. 1 in the first embodiment.
Figure 6:
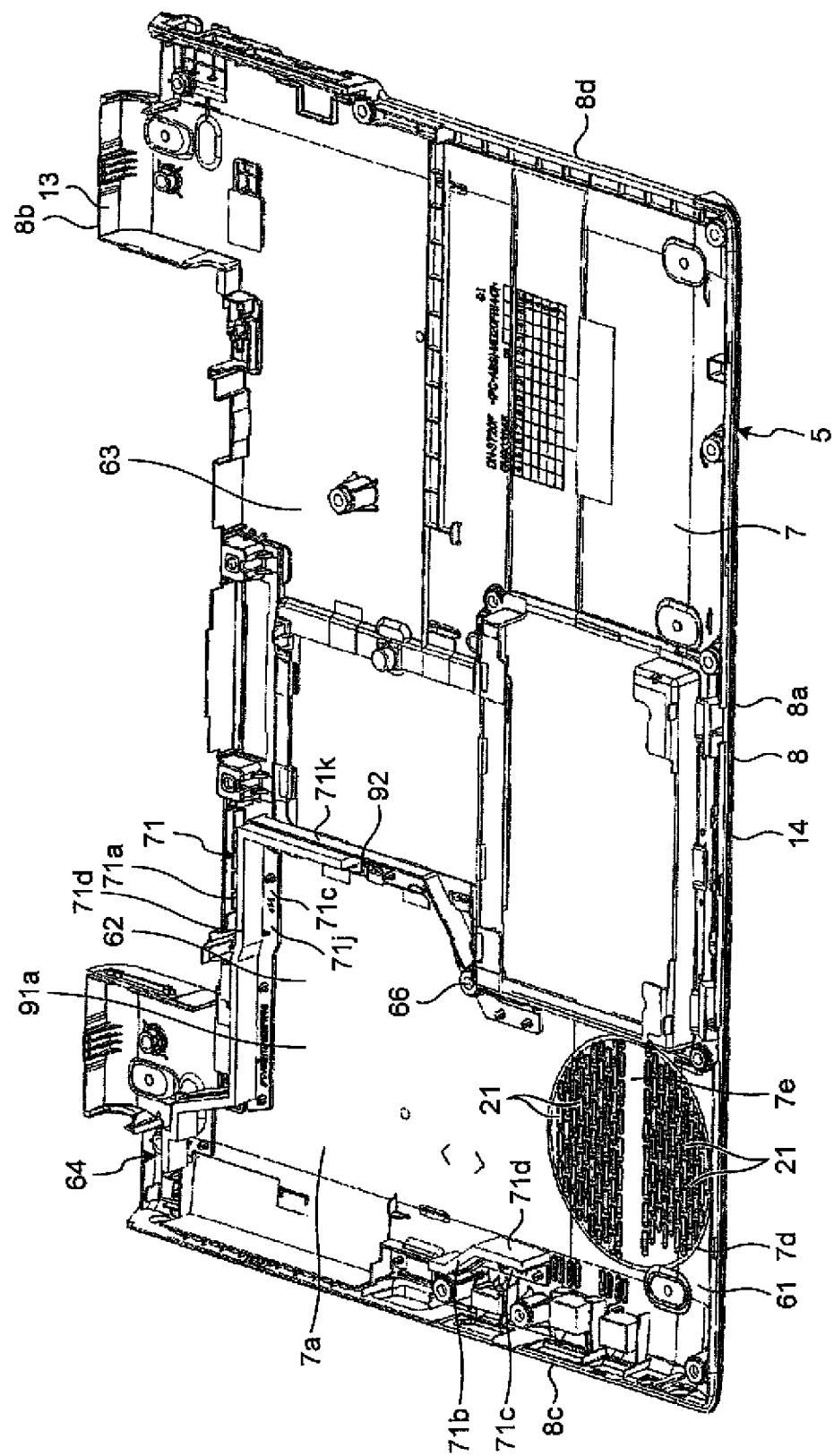
FIG. 6 is an exemplary perspective view illustrating an inside of the lower wall of the electronic device of FIG. 1 in the first embodiment.

As illustrated in FIG. 2, a plurality of legs 19 are provided in the lower wall 7 of the housing 5. The legs 19 come in contact with the upper surface of the desk, whereby the lower wall 7 of the housing 5 is supported at a position separated from the upper surface of the desk. As illustrated in FIGS. 2 and 3, the housing 5 comprises a first air inlet port 21, a second air inlet port 22 (see FIG. 3), a third air inlet port 23, and a fourth air inlet port 36. For example, the first air inlet port 21, the second air inlet port 22, the third air inlet port 23, and the fourth air inlet port 36 are concentrated in the left front end of the housing 5 while separated from one another. As illustrated in FIG. 6, the first air inlet ports 21 are provided in a circular opposing portion 7d provided in the lower wall 7 of the housing 5. The circular opposing portion 7d is provided opposite a cooling fan 24. A traverse portion 7e is formed in the circular opposing portion 7d. A harness of the cooling fan 24 is attached to an inner surface of the traverse portion 7e, and the harness is covered with the traverse portion 7e.

As illustrated in FIG. 2, the first air inlet port 21, the third air inlet port 23, and the fourth air inlet port 36 are provided in the lower wall 7. The first air inlet port 21 is located below the cooling fan 24 while facing the cooling fan 24. The third air inlet port 23 has the opening between the first air inlet port 21 and the front wall 8a at a location out of underneath of the cooling fan 24. The fourth air inlet port 36 has the opening between the first air inlet port 21 and the left sidewall 8c at a location below the cooling fan 24.

As illustrated in FIG. 3, the second air inlet port 22 is provided in the left sidewall 8c. The second air inlet port 22 is an opening through which various connectors 25 are exposed. The second air inlet port 22 causes external air to flow in the housing 5 through a gap between the connector 25 and the housing 5.

As illustrated in FIG. 3, the housing 5 comprises a first exhaust port 26 and a second exhaust port 27. The first exhaust port 26 is provided in the left sidewall 8c at the rear end 13 of the housing 5. For example, the first exhaust port 26 is located from a lateral portion to the backside of the keyboard 9. The first exhaust port 26 laterally faces a heat sink 28. The second exhaust port 27 is provided in the lower wall 7 at the rear end 13 of the housing 5 and faces the heat sink 28 from underneath. The second exhaust ports 27 are provided along the front-back direction, and a plurality of recesses 37 are formed between the second exhaust ports 27 along the front-back direction. The recesses 37 do not penetrate the lower wall 7. The size of the recess 37 is substantially equal to that of the second exhaust port 27 in the plan view. A pawl which latches the cover 12 is provided in the base 11 near the recess 37. The recess 37 enhances the rigidity of the base 11 near the pawl. As illustrated in FIG. 2, an opening 30 (see FIG. 2) is provided in the lower wall 7 to expose a docking connector 29 to the outside.

Figure 4:
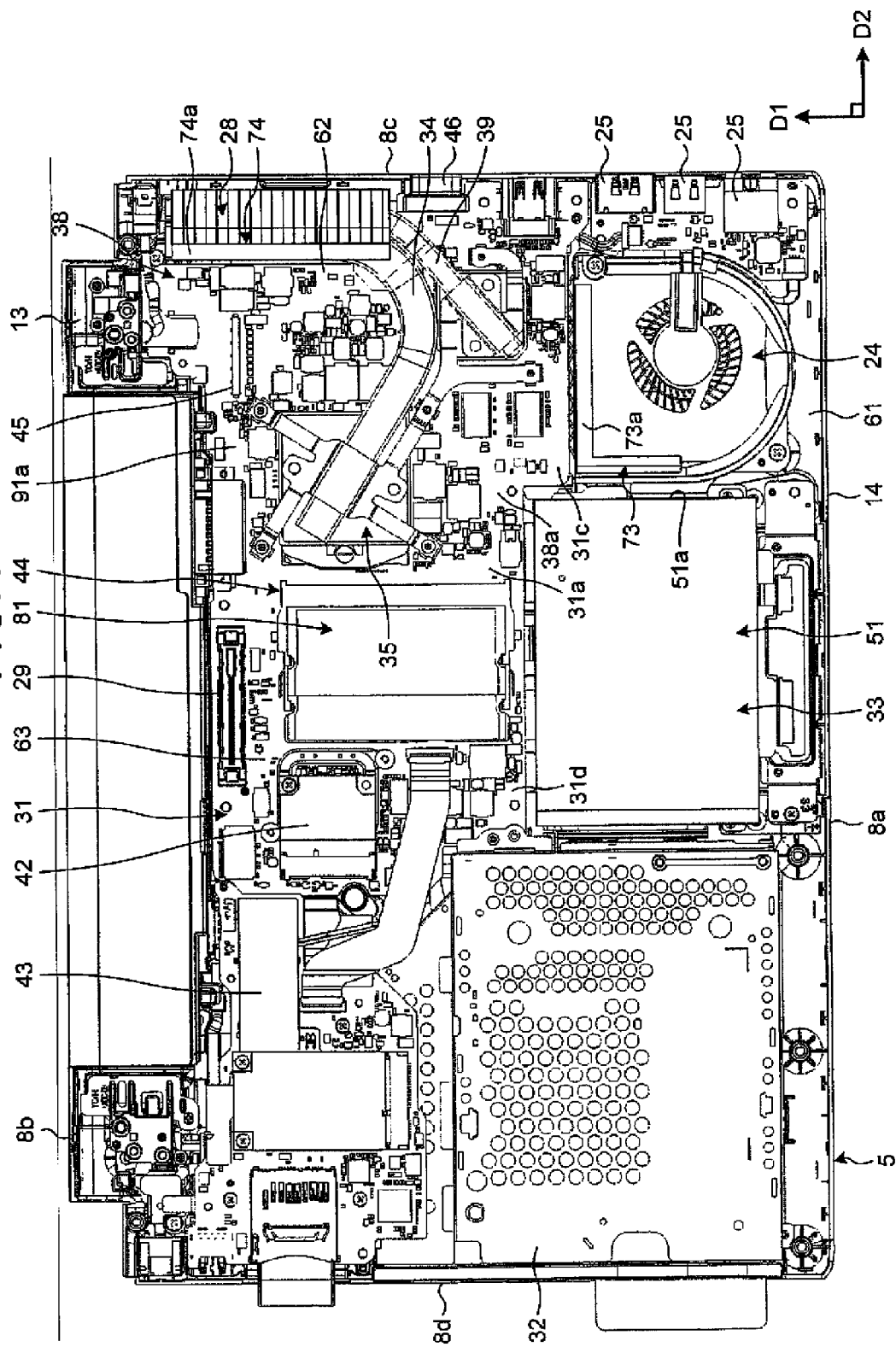
FIG. 4 is an exemplary plan view illustrating an inside of the electronic device of FIG. 1 in the first embodiment.

As illustrated in FIG. 4, a circuit board 31, an optical disk drive (ODD) 32, a storage device 33, the heat sink 28, a heat pipe 34, a radiator plate 35, and the cooling fan 24 are housed in the housing 5. For example, the circuit board 31 is a main board.

The circuit board 31 comprises a first surface 31a (see FIG. 10) and a second surface 31b (see FIG. 10) located opposite the first surface 31a. While the first surface 31a and the second surface 31b are illustrated by way of example as the lower surface and the upper surface, respectively, the first surface 31a may be the upper surface while the second surface 31b may be the lower surface.

Figure 8:
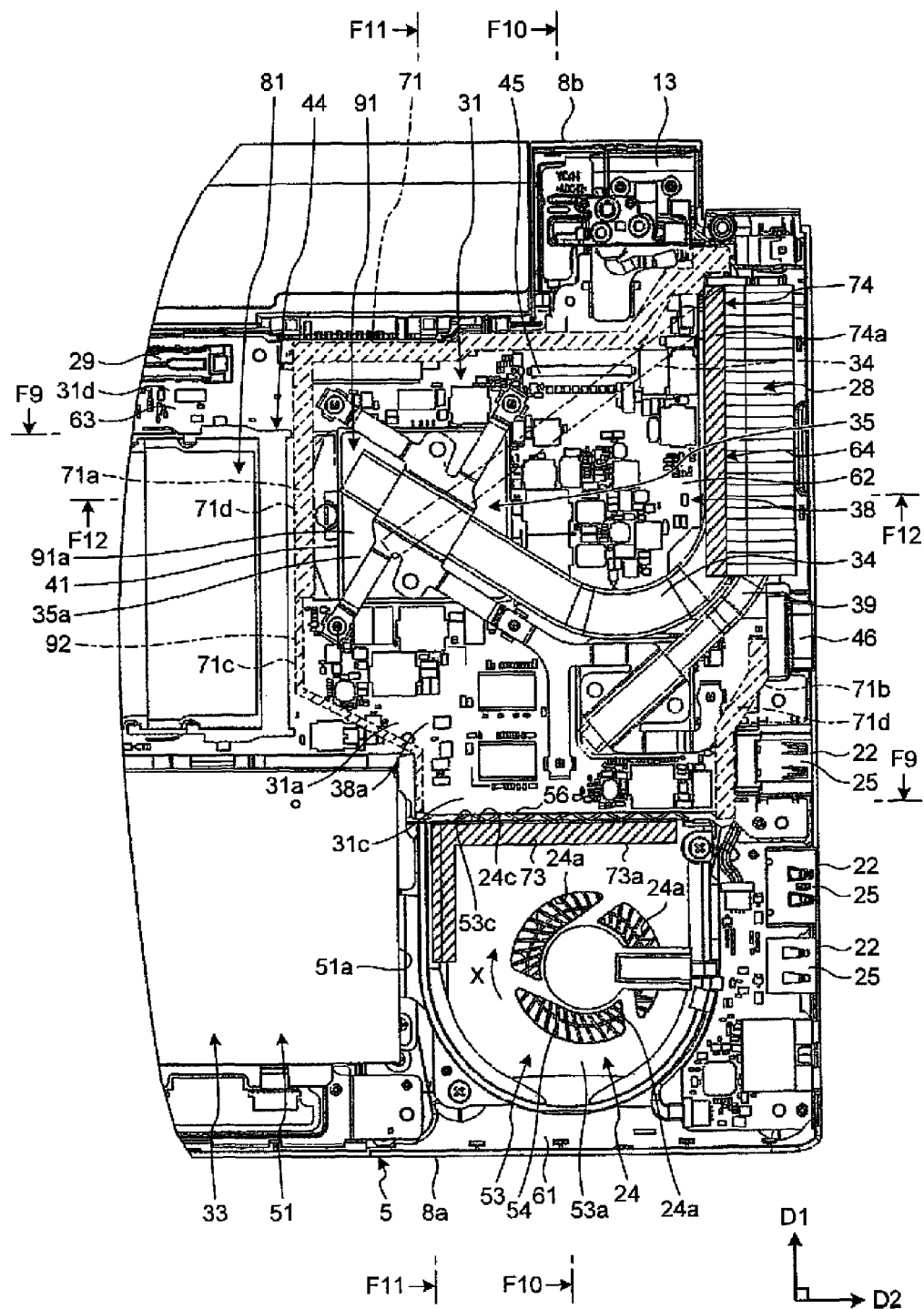
FIG. 8 is an exemplary plan view illustrating the inside of the electronic device of FIG. 1 in the first embodiment.

As illustrated in FIGS. 4 and 8, electronic components are mounted on the first surface 31a of the circuit board 31. Examples of the electronic components include a central processing unit (CPU) 41, a platform controller hub (PCH) 42, a power-circuit component 43, a memory slot connector 44, an LCD connector 45, an I/O connector 46, a first power-supply coil, and a second power-supply coil.

The circuit board 31 and the electronic components such as the CPU 41 and the PCH 42 mounted thereon constitute a circuit board device 38 and are housed in the housing 5. The circuit board device 38 comprises a first portion 38a that includes the first surface 31a of the circuit board 31 and a second portion 38b (see FIG. 10) that includes the second surface 31b of the circuit board 31 and is located opposite the first portion 38a with respect to the circuit board 31. The upper inner surface of the inner surface of the housing 5 includes an inner surface 6a of the upper wall 6, while the lower inner surface of the inner surface of the housing 5 includes an inner surface 7a of the lower wall 7. The circuit board device 38 is located between the inner surface 6a and the inner surface 7a.

The CPU 41 is an example of a first heat generating element and generates the largest amount of heat in the circuit board 31. The PCH 42 is an example of a second heat generating element which can be cooled by, for example, natural heat release. The power-circuit component 43 is an example of a third heat generating element and generates a relatively large amount of heat amount in the circuit board 31.

As illustrated in FIG. 10, a power-circuit component 49 is mounted on the second surface 31b of the circuit board 31. The power-circuit component 49 is an example of a heat generating element. The heat generating elements mounted on the circuit board 31 are not limited to the above components.

As illustrated in FIG. 4, a direction from the front end 14 of the housing 5 toward the rear end 13 is defined as a first direction D1. A direction from the right sidewall 8d toward the left sidewall 8c, which is substantially perpendicular to the first direction D1, is defined as a second direction D2. An ejection port 24c of the cooling fan 24, which will be described later, is opened in the first direction D1.

The right, left, top, and bottom are defined herein based on a normal orientation (orientation of FIG. 1) of the electronic device 1. Therefore, as illustrated in FIGS. 2, 4, 5, and 7, expressions of the right and left and the top and bottom are inverted in the description of the drawing in which the electronic device 1 is illustrated upside down.

As illustrated in FIG. 10, the circuit board 31 is located below the keyboard placing portion 17. As illustrated in FIG. 4, the circuit board 31 comprises a first part 31c located between the cooling fan 24 and the heat sink 28 and a second part 31d located out of a region between the cooling fan 24 and the heat sink 28.

The cooling fan 24 faces the first part 31c in the opening direction (the first direction D1) of the ejection port 24c of the cooling fan 24. That is, the first part 31c is directly exposed to cooling wind ejected from the cooling fan 24. The first part 31c faces the heat sink 28 in the second direction D2. On the other hand, the second part 31d does not face the cooling fan 24 in the opening direction of the ejection port 24c of the cooling fan 24.

The CPU 41 and the power-circuit component 43 are mounted on the first part 31c of the circuit board 31 and located between the heat sink 28 and the cooling fan 24. The PCH 42 is mounted on the second part 31d of the circuit board 31 and located out of the region between the cooling fan 24 and the heat sink 28.

Figure 12:
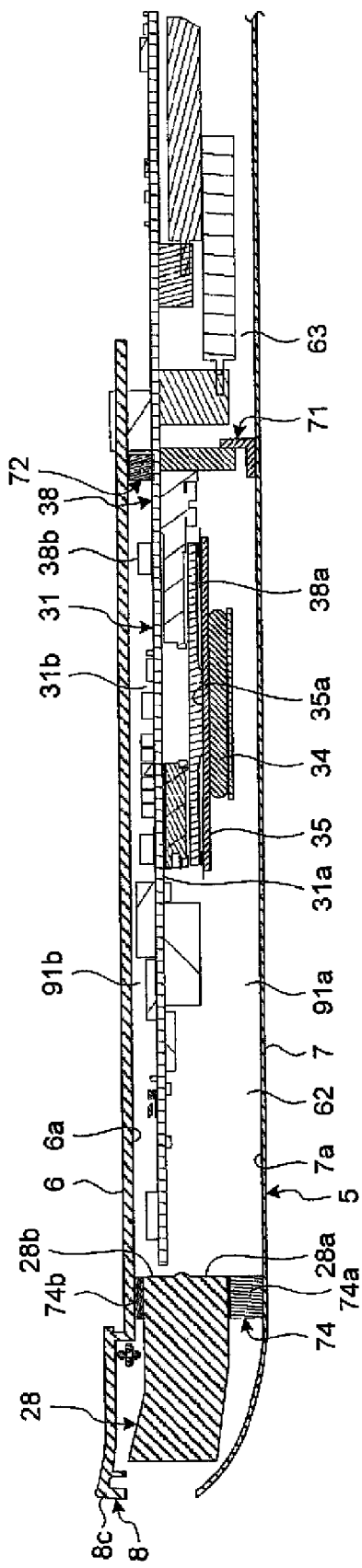
FIG. 12 is an exemplary cross-sectional view taken along line F12-F12 of FIG. 8 in the first embodiment.

The heat sink 28 of FIGS. 4 and 12 is an example of a radiation portion and is a fin unit comprising a plurality of fins. The heat sink 28 is located at the rear end 13 of the housing 5 to face the first exhaust port 26 of the housing 5. The heat sink 28 is located below the keyboard placing portion 17. In the heat sink 28, the gap between the fins is oriented toward the first exhaust port 26. The heat pipe 34 and a second heat pipe 39 are connected to the heat sink 28. The heat sink 28 is housed in the housing 5 at a position facing the first exhaust port 26, and constitutes a ventilation path 91 (a first ventilation path 91a and a second ventilation path 91b). The electronic components are located in the first ventilation path 91a and the second ventilation path 91b.

As illustrated in FIG. 8, the CPU 41 is connected to the heat sink 28 through the radiator plate 35 and the heat pipe 34. The heat pipe 34 is an example of a heat transport member. The heat pipe 34 extends from the CPU 41 to the heat sink 28. The heat pipe 34 thermally connects the CPU 41 to the heat sink 28 to move the heat of the CPU 41 to the heat sink 28. That is, the heat pipe 34 connects the electronic component and the heat sink 28.

For example, the radiator plate 35 is a sheet-metal member. The radiator plate 35 comprises a first part 35a that faces the CPU 41 and is thermally connected to the CPU 41. For example, the radiator plate 35 is not thermally connected to the power-circuit component 43.

As illustrated in FIG. 4, the ODD 32 is located opposite the circuit board 31 and housed on the right of the housing 5. The storage device 33 may be, for example, a hard disk drive (HDD). The storage device 33 is located at the front end 14 of the housing 5 and located adjacent to the cooling fan 24. The storage device 33 comprises a case 51 and a magnetic disk (not illustrated) housed in the case 51. Aside surface (end face) 51a of the case 51 is spread in a planar manner and laterally faces the cooling fan 24. The side surface 51a of the case 51 forms an upright wall located opposite the left sidewall 8c of the housing 5 to face the cooling fan 24.

Figure 11:
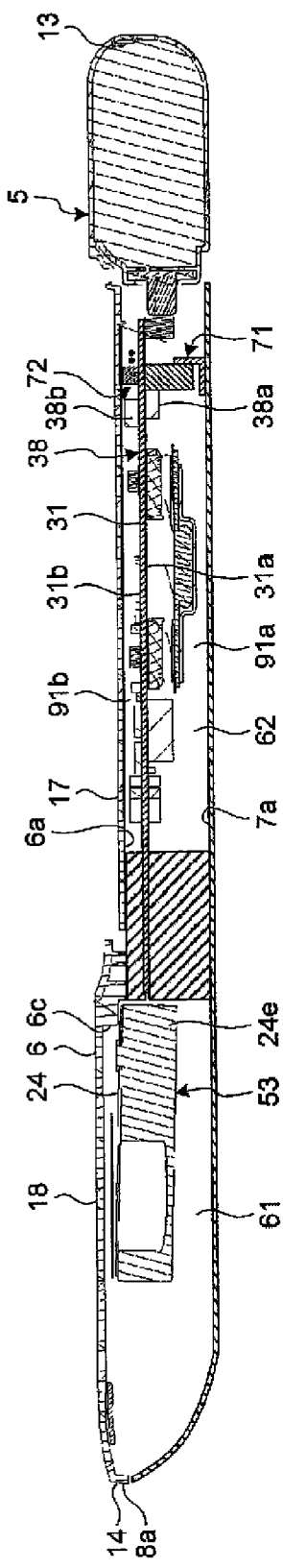
FIG. 11 is an exemplary cross-sectional view taken along line F11-F11 of FIG. 8 in the first embodiment.

As illustrated in FIG. 8, for example, the cooling fan 24 is located at the front end 14 on the left of the housing 5 while separated from the heat sink 28. As illustrated in FIG. 10, the cooling fan 24 is located below the palm rest 18. That is, the cooling fan 24 is located not below the keyboard placing portion 17 in which the housing 5 is relatively thin, but below the palm rest 18 in which the housing 5 is relatively thick. As illustrated in FIG. 10, a gap is provided between the cooling fan 24 and the lower wall 7 of the housing 5 and between the cooling fan 24 and the upper wall 6 of the housing 5. As illustrated in FIG. 11, an opposing portion 6c that vertically overlaps a rear end 24e of the cooling fan 24 is provided in the upper wall 6 of the housing 5, which faces an upper portion of the rear end 24e. The opposing portion 6c narrows a gap between a first chamber 61 and a second chamber 62, which will be described later.

The cooling fan 24 is a centrifugal fan, and comprises a fan case 53 and an impeller 54 that is rotated in the fan case 53. The fan case 53 comprises a first suction port 24a, a second suction port 24b, and the ejection port 24c.

As illustrated in FIG. 10, the fan case 53 comprises a lower surface 53a facing the lower wall 7, an upper surface 53b located opposite the lower surface 53a to face the upper wall 6, and a peripheral wall 53c facing the circuit board 31. The first suction port 24a is provided in the lower surface 53a of the fan case 53 to face the first air inlet port 21 of the lower wall 7. The second suction port 24b is provided in the upper surface 53b of the fan case 53 and has the opening on the opposite side to the first suction port 24a. The second suction port 24b faces the palm rest 18 with a gap interposed therebetween. A step portion 53d is formed in the upper surface 53b according to the shape of the housing 5 in which the thickness decreases toward the end. In this manner, the fan case 53 comprises the lower surface 53a and the upper surface 53b, which are of a pair of opposing surfaces that face the inner surface of the housing 5, and the peripheral wall 53c as the side surface provided between the pair of opposing surfaces (lower surface 53a and upper surface 53b).

As illustrated in FIG. 10, as described above, the ejection port 24c is opened in the first direction D1 and oriented toward the CPU 41 of the circuit board 31. The thickness of the ejection port 24c is larger than that of the circuit board 31. The circuit board 31 is located as being close to the side of the upper surface 53b in the thickness direction of the ejection port 24c, and faces the ejection port 24c.

That is, the ejection port 24c is vertically opened to the circuit board 31. The ejection port 24c comprises a first part 24ca located on the side of the first surface 31a of the circuit board 31 and a second part 24cb located on the side of the second surface 31b of the circuit board 31.

The cooling fan 24 sucks air in the housing 5 from the first suction port 24a and the second suction port 24b, and ejects the air from the ejection port 24c toward the CPU 41. At this point, the cooling fan 24 ejects the air to both the upper and lower sides of the circuit board 31.

On the other hand, as illustrated in FIG. 12, the thickness of the heat sink 28 is larger than that of the circuit board 31. The circuit board 31 is located as being close to the upper end of the heat sink 28 in the thickness direction of the heat sink 28, and faces the heat sink 28.

That is, the heat sink 28 is vertically exposed to the circuit board 31. The heat sink 28 comprises a first part 28a located on the side of the first surface 31a of the circuit board 31 and a second part 28b located on the side of the second surface 31b of the circuit board 31. The first part 28a is exposed to the air that flows onto the side of the first surface 31a of the circuit board 31. The second part 28b is exposed to the air that flows onto the side of the second surface 31b of the circuit board 31.

As illustrated in FIGS. 8 and 10, an end of the circuit board 31 that faces the ejection port 24c of the cooling fan 24 comprises a component non-mounted region 56. For example, the component non-mounted region 56 has a width of 5 mm and extends in the width direction of the ejection port 24c along the rim of the circuit board 31. The component non-mounted region 56 is a margin that is placed on a rail of a mounting machine in a process such as a reflow process, in which a component is mounted on the circuit board. In the component non-mounted region 56, no component is mounted, and the flow of air ejected from the cooling fan 24 is not likely to be obstructed.

As illustrated in FIG. 8, the electronic device 1 comprises a wind shield portion 64 that partitions the first chamber (first region) 61, the second chamber (second region) 62, and a third chamber (third region) 63 in the housing 5. The first chamber 61 is an air inlet chamber in which the cooling fan 24 sucks external air (fresh air). The second chamber 62 is a duct through which cooling wind flows in a concentrated manner from the cooling fan 24 to the heat sink 28, and in which components generating a relatively large amount of heat are mounted in a concentrated manner. For example, a component generating a relatively small amount of heat is housed in the third chamber 63. The term "chamber" as used herein refers to a region (part) in the housing 5, and the chamber need not necessarily be completely shielded from another chamber (another region).

Figure 7:
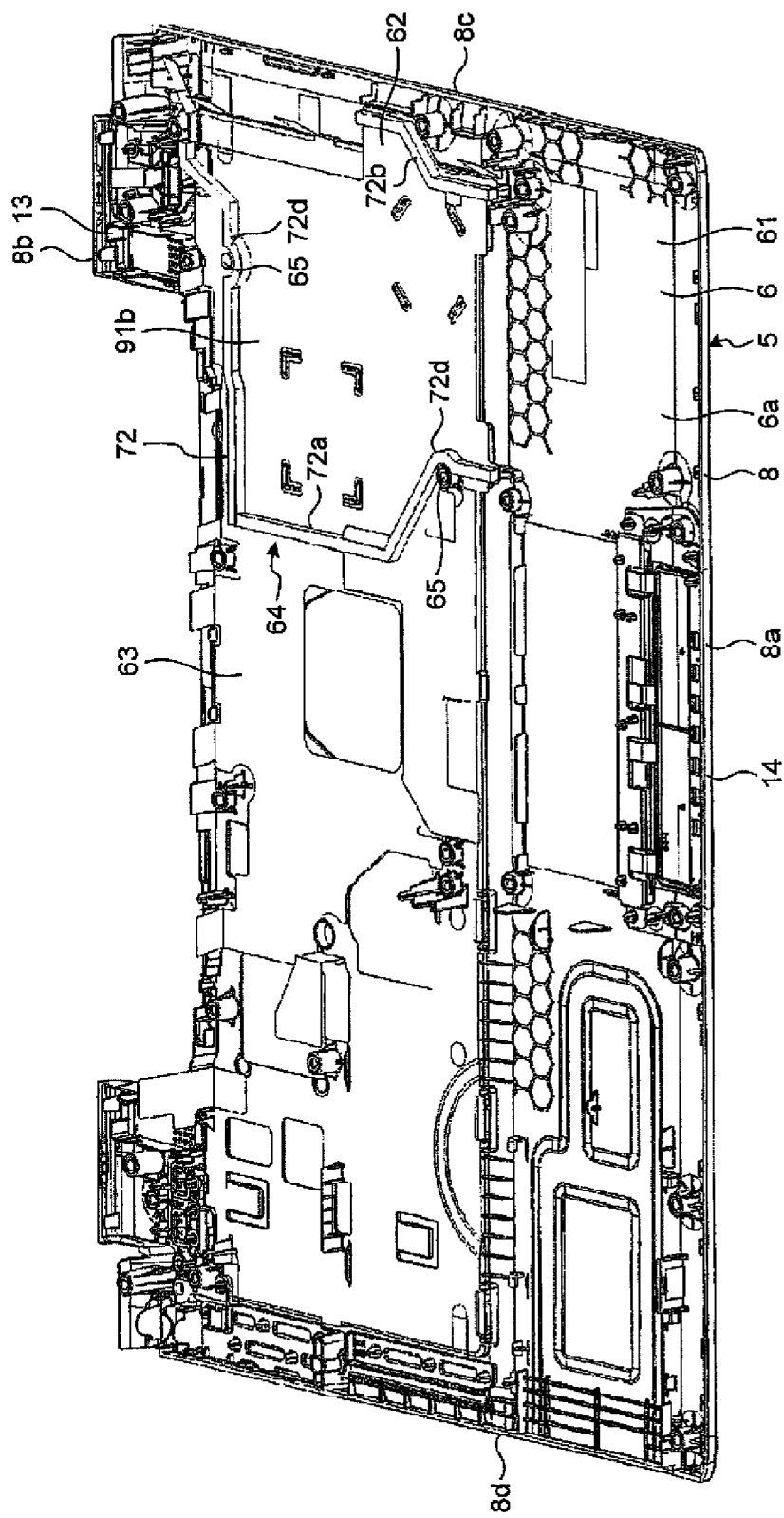
FIG. 7 is an exemplary perspective view illustrating an inside of an upper wall of the electronic device of FIG. 1 in the first embodiment.

As illustrated in FIGS. 6 to 8, in the first embodiment, the wind shield portion 64 comprises a first wall portion 71, a second wall portion 72, a third wall portion 73, and a fourth wall portion 74. The first wall portion 71, the second wall portion 72, the third wall portion 73, and the fourth wall portion 74 are equivalent to a guide wall. The first wall portion 71, the second wall portion 72, the third wall portion 73, and the fourth wall portion 74 are also equivalent to a wind introducing member.

The first wall portion 71 is provided between the first portion 38a of the circuit board device 38 and the inner surface 7a of the lower wall 7 constituting the upper inner surface of the inner surface of the housing 5. The first wall portion 71 abuts on the first portion 38a. The first wall portion 71 constitutes a first ventilation path 91a from the ejection port 24c of the cooling fan 24 to the first exhaust port 26 and the second exhaust port 27 through the side of the first portion 38a of the circuit board device 38.

The first wall portion 71 comprises a first portion 71a and a second portion 71b. The first portion 71a reaches near the rear portion of the heat sink 28 from near the right of the ejection port 24c of the cooling fan 24 through an interval between the memory slot connector 44 and the CPU 41. The second portion 71b reaches near the front portion of the heat sink 28 from near the left of the ejection port 24c of the cooling fan 24. Part of the first portion 71a of the first wall portion 71 is separated from the ejection port 24c of the cooling fan 24 and located at a position facing the ejection port 24c.

Figure 9:
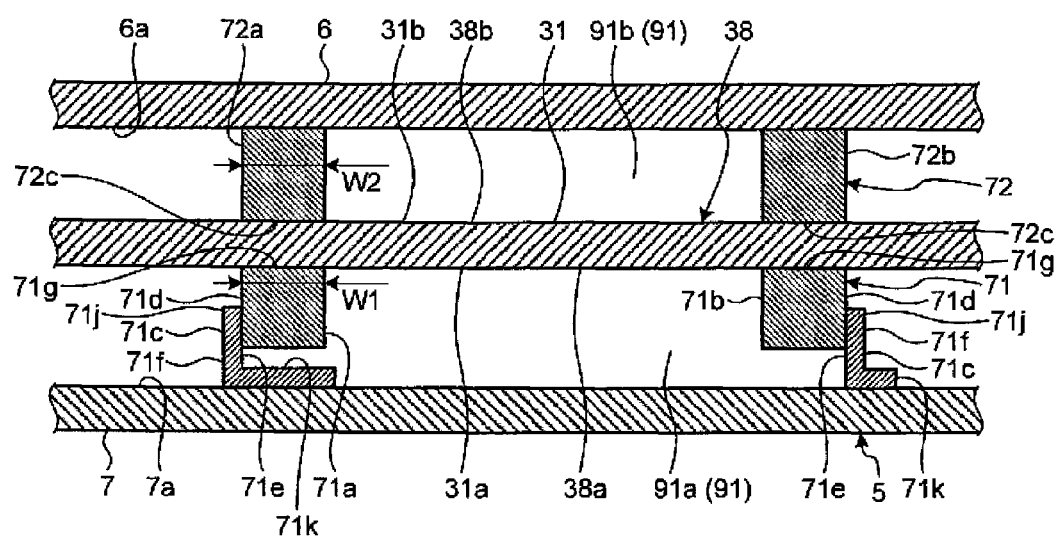
FIG. 9 is an exemplary schematic sectional view taken along line F9-F9 of the electronic device of FIG. 8 in the first embodiment.

As illustrated in FIG. 9, the first wall portion 71 comprises a first member 71c and a second member 71d. The first member 71c is provided in the inner surface 7a of the lower wall 7 as the inner surface of the housing 5 by, for example, solvent welding. The first member 71c is fixed to the inner surface 7a of the lower wall 7. The first wall portion 71 includes a part formed into an L-shape in cross-section. The L-shaped part of the first wall member comprises a first wall 71k fixed to the inner surface 7a of the lower wall 7 and a second wall 71j projecting at an edge of the first wall 71k. For example, the first wall portion 71 is made of resin. In other words, for example, the first wall portion 71 is made of plastic. The first member 71c functions as a vertical wall to enhance the rigidity of the housing 5. The first member 71c is one that is different from the lower wall 7 of the housing 5. The electronic component is not illustrated in FIG. 9.

The second member 71d is attached to the first member 71c by, for example, a double-sided adhesive tape. The second member 71d abuts on the circuit board device 38. The leading end of the second member 71d abuts on a plurality of electronic components mounted on the circuit board 31. The electronic components have relatively low in height, and their heights fall within a predetermined range. The second member 71d has a rigidity lower than that of the first member 71c. The second member 71d is made of an elastic material such as sponge and rubber. The second member 71d is attached to a first side surface 71e as the side surface of the first member 71c. More specifically, the first member 71c comprises the first side surface 71e that constitutes the first ventilation path 91a and a second side surface 71f as the rear surface of the first side surface 71e, and the second member 71d is attached to the first side surface 71e. The first wall portion 71 comprises a first abutment surface 71g at the leading end of the second member 71d. The first abutment surface 71g extends along the first portion 38a of the circuit board device 38 in contact therewith. The second member 71d is separated from the inner surface of the housing 5.

In the inside of the housing 5, a communication port 92 that communicates the inside and the outside of the first ventilation path 91a is provided between part of the first wall portion 71 and the inner surface 7a of the lower wall 7 as the inner surface of the housing 5. More specifically, the second member 71d is not partially provided in a portion that faces the memory slot connector 44 in the first portion 71a of the first wall portion 71, whereby the communication port 92 is provided between the first member 71c and the inner surface 7a of the lower wall 7. The communication port 92 communicates the second chamber 62 and the third chamber 63.

The second wall portion 72 is provided between the second portion 38b of the circuit board device 38 and the inner surface 6a of the upper wall 6 as the inner surface of the housing 5. The second wall portion 72 abuts on the second portion 38b of the circuit board device 38, and is arranged overlapping the first wall portion 71 with the circuit board device interposed therebetween. The second wall portion 72 constitutes a second ventilation path 91b from the ejection port 24c of the cooling fan 24 to the first exhaust port 26 and the second exhaust port 27 through the side of the second portion 38b of the circuit board device 38. At this point, the ventilation path 91 comprises the second ventilation path 91b and the first ventilation path 91a.

The second wall portion 72 comprises a first portion 72a and a second portion 72b. The first portion 72a extends along the first portion 71a of the first wall portion 71 to near the rear portion of the heat sink 28 from near the right of the ejection port 24c of the cooling fan 24. The second portion 72b extends along the second portion 71b of the first wall portion 71 to near the front portion of the heat sink 28 from near the left of the ejection port 24c of the cooling fan 24. Part of the first portion 72a of the second wall portion 72 is separated from the ejection port 24c of the cooling fan 24 and located at a position facing the ejection port 24c. The second wall portion 72 is provided in the inner surface 6a of the upper wall 6 as the upper inner surface of the housing 5 by, for example, a double-sided adhesive tape. The second wall portion 72 is made of an elastic material such as sponge and rubber. The second wall portion 72 is lower than the first wall portion 71. The second wall portion 72 comprises a second abutment surface 72c that extends along the second portion 38b of the circuit board device 38 in contact therewith. At this point, a first width W1 of the first abutment surface 71g in a direction (horizontal direction in FIG. 9) perpendicular to a direction in which the first abutment surface 71g of the first wall portion 71 extends is substantially equal to a second width W2 of the second abutment surface 72c in a direction (horizontal direction in FIG. 9) perpendicular to a direction in which the second abutment surface 72c extends.

As illustrated in FIG. 7, a first projection 65 is provided in the inner surface 6a of the upper wall 6 as the inner surface of the housing 5. For example, the first projection 65 is a boss that supports the circuit board 31. A bent portion 72d that is bent (curved) along the first projection 65 is provided in the second wall portion 72. The first projection 65 is located outside the bent portion 72d (outside the second ventilation path 91b). Alternatively, the first projection 65 may be located inside the bent portion 72d (in the second ventilation path 91b). The first projection 65 may be provided in the inner surface 7a of the lower wall 7. In this case, a bent portion that is bent (curved) along the first projection 65 may be provided in the first wall portion 71.

As illustrated in FIG. 6, a second projection 66 is provided in the inner surface 7a of the lower wall 7 as the inner surface of the housing 5. The second projection 66 constitutes the first ventilation path 91a and is included in the wind shield portion 64. For example, the second projection 66 is a boss that supports the circuit board 31. The edge of the first member 71c of the first portion 71a of the first wall portion 71 is formed in a shape along the second projection 66. Alternatively, the second projection 66 may be provided in the inner surface 6a of the upper wall 6 to constitute the second ventilation path 91b.

Figure 5:
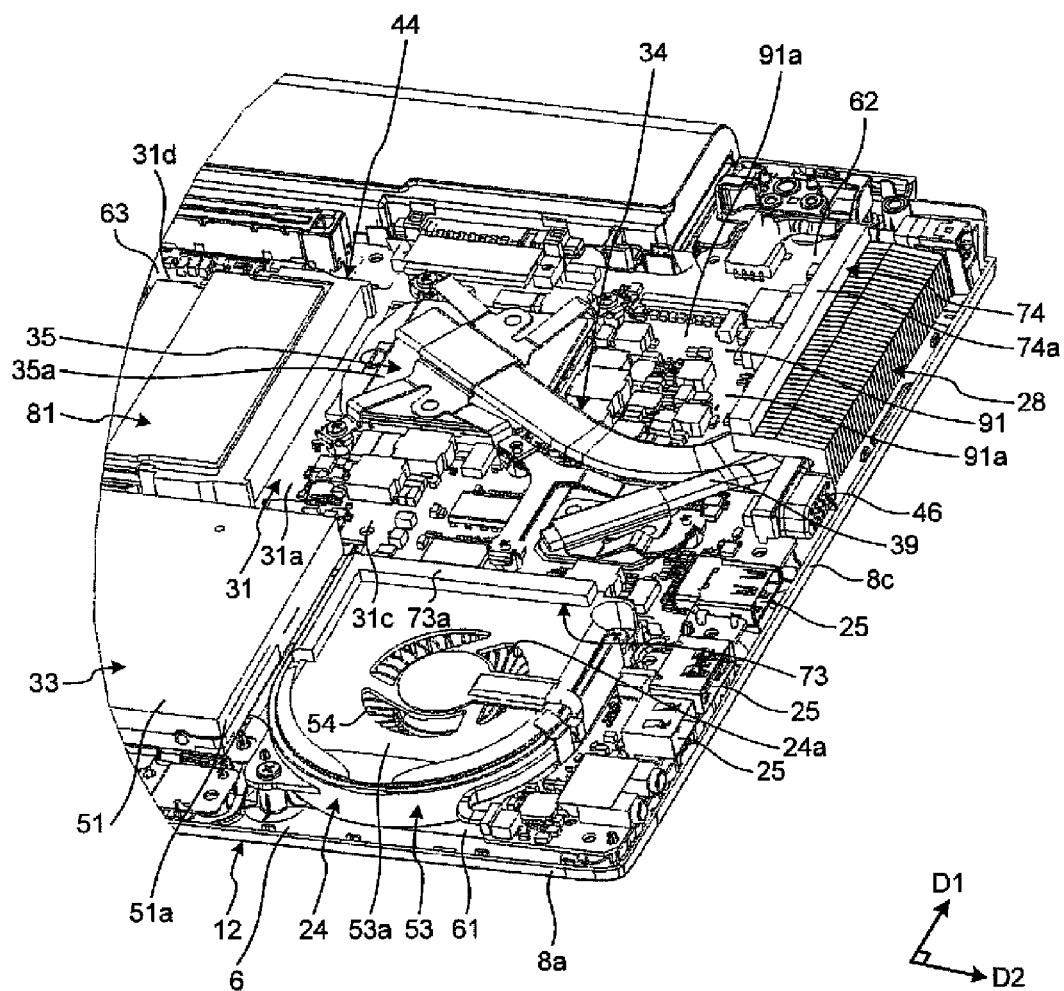
FIG. 5 is an exemplary perspective view illustrating the inside of the electronic device of FIG. 1 in the first embodiment.

As illustrated in FIGS. 5 and 10, the third wall portion 73 is provided between the fan case 53 of the cooling fan 24 and the inner surface of the housing 5. The third wall portion 73 comprises a first portion 73a and a second portion 73b. The first portion 73a is provided between the lower surface 53a that is one of a pair of opposing surfaces of the fan case 53 and the inner surface 7a of the lower wall 7 as the inner surface of the housing 5. The second portion 73b is provided between the upper surface 53b as the other of the pair of opposing surfaces of the fan case 53 and the inner surface 6a of the upper wall 6 as the inner surface of the housing 5. The first portion 73a and the second portion 73b are made of an elastic material such as sponge and rubber. The first portion 73a and the second portion 73b are attached to the fan case 53 by, for example, a double-sided adhesive tape.

As illustrated in FIG. 12, the fourth wall portion 74 is provided between the heat sink 28 and the inner surface of the housing 5. The fourth wall portion 74 comprises a first portion 74a that is provided between the lower surface of the heat sink 28 and the inner surface 7a of the lower wall 7 and a second portion 74b that is provided between the upper surface of the heat sink 28 and the inner surface 6a of the upper wall 6. The first portion 74a and the second portion 74b are made of an elastic material such as sponge and rubber. The first portion 74a and the second portion 74b are attached to the heat sink 28 by, for example, a double-sided adhesive tape.

The first to fourth wall portions 71, 72, 73, and 74 are examples of a non-conductive member (insulator). In FIG. 8, the component constituting the wind shield portion 64 is hatched for the sake of convenience.

A wind shield structure of the first chamber 61 will be described.

As illustrated in FIG. 8, the first portion 73a of the first wall portion 73 is attached to the lower surface 53a of the cooling fan 24. The first portion 73a extends in the width direction (the second direction D2) of the ejection port 24c along the ejection port 24c of the cooling fan 24. That is, the first portion 73a is provided between the first suction port 24a and the ejection port 24c to partition the space inside the housing 5. The first portion 73a also extends in the first direction D1 along the right end of the cooling fan 24. The first portion 73a is located opposite the left sidewall 8c of the housing 5 with respect to the first suction port 24a of the cooling fan 24. That is, the first suction port 24a of the cooling fan 24 is located between the first portion 73a and the left sidewall 8c of the housing 5. Therefore, the first portion 73a extends substantially in an L-shape.

As illustrated in FIG. 10, in the upper surface 53b of the cooling fan 24, the second portion 73b of the third wall portion 73 is formed to be substantially plane-symmetrical to the first portion 73a. That is, the first portion 73a and the second portion 73b are arranged overlapping each other with the fan case 53 interposed therebetween. The second portion 73b extends in the width direction of the ejection port 24c along the ejection port 24c of the cooling fan 24. The second portion 73b is provided between the second suction port 24b and the ejection port 24c to partition the space inside the housing 5. The second portion 73b extends in the first direction D1 along the right end of the cooling fan 24. The second portion 73b is provided between the upper surface 53b of the cooling fan 24 and the inner surface (inner surface of the palm rest 18) of the upper wall 6 of the housing 5. Therefore, the second portion 73b extends substantially in an L-shape. The third wall portion 73 is compressed in the gap between the fan case 53 and the inner surface of the housing 5 to tightly seal the gap.

Figure 14:
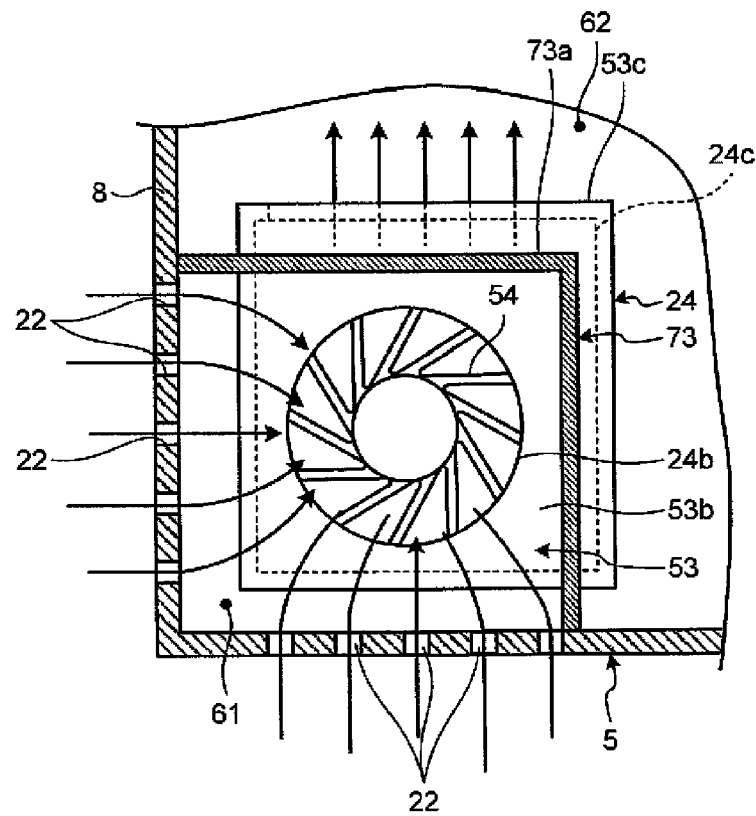
FIG. 14 is an exemplary cross-sectional view taken along line F14-F14 of FIG. 13 in the first embodiment.

Thus, as illustrated in FIG. 14, the first chamber 61 surrounded by the third wall portion 73, the left sidewall 8c of the housing 5, and the front wall 8a of the housing 5 is formed in a corner of the housing 5. That is, the third wall portion 73 partitions the housing 5 into the first chamber 61 and the second chamber 62.

In the first embodiment, the third wall portion 73 is provided on the surface of the cooling fan 24, but not in the region outside the cooling fan 24. That is, in the housing 5, the third wall portion 73 partitions the first chamber 61 not completely but partially.

Alternatively, in the housing 5, the third wall portion 73 may extend to the region out of the cooling fan 24 to completely partition the first chamber 61. In the first embodiment, the side surface 51a of the case 51 of the storage device 33 subsidiarily forms the wall surface of part of the first chamber 61.

As illustrated in FIGS. 8 and 10, the first air inlet port 21, the second air inlet port 22, and the third air inlet port 23 of the housing 5 and the first suction port 24a and the second suction port 24b of the cooling fan 24 are exposed in the first chamber 61. There is no heat generating element mounted on the circuit board 31 in the first chamber 61. The first chamber 61 is communicated with the outside of the housing 5 through the first air inlet port 21, the second air inlet port 22, and the third air inlet port 23, and the external air (fresh air) can flow in the first chamber 61. Therefore, the air in the first chamber 61 has a temperature lower than that of the air in the other chambers.

A wind shield structure of the second chamber 62 will be described.

As illustrated in FIG. 8, the second chamber 62 is partitioned into the first and third chambers 61 and 63 by the first wall portion 71 and the second wall portion 72. Heat generating elements such as the CPU 41 are located in the second chamber 62. In combination with the lower wall 7 of the housing 5, the first wall portion 71 constitutes the first ventilation path 91a in the ventilation path 91 having the duct structure in which cooling wind flows from the cooling fan 24 toward the heat sink 28. In combination with the upper wall 6 of the housing 5, the second wall portion 72 constitutes the second ventilation path 91b (see FIG. 10) in the ventilation path 91 having the duct structure in which cooling wind flows from the cooling fan 24 toward the heat sink 28. The first ventilation path 91a is formed substantially in an L-shape on the first surface 31a of the circuit board 31, i.e., between the circuit board 31 and the lower wall 7 of the housing 5. The second ventilation path 91b is formed substantially in the same L-shape as the first ventilation path 91a on the second surface 31b of the circuit board 31, i.e., between the circuit board 31 and the upper wall 6 of the housing 5. The first ventilation path 91a and the second ventilation path 91b are formed substantially plane-symmetrical with respect to the circuit board 31. The first wall portion 71 is compressed between the inner surface of the housing 5 and the circuit board device 38 to tightly seal the gap between the inner surface of the housing 5 and the circuit board device 38. Therefore, cooling wind sent from the cooling fan 24 is guided by the first wall portion 71 to the heat sink 28.

As illustrated in FIG. 8, the CPU 41, the power-circuit component 49, the heat pipe 34, and the radiator plate 35 are located in the first ventilation path 91a.

The air ejected from the first part 24ca of the ejection port 24c of the cooling fan 24 flows through the first ventilation path 91a to the first part 28a of the heat sink 28. The air ejected from the second part 24cb of the ejection port 24c of the cooling fan 24 flows through the second ventilation path 91b to the second part 28b of the heat sink 28. The gap between the second surface 31b of the circuit board 31 and the upper wall 6 of the housing 5 is smaller than the gap between the first surface 31a and the lower wall 7 of the housing 5. Electronic components such as the CPU 41, the heat pipe 34, and the heat sink 28 are cooled by cooling wind flowing through the first ventilation path 91a and the second ventilation path 91b.

At this point, part of the cooling wind flows in the third chamber 63 from the communication port 92, thereby cooling a memory 81 of the third chamber 63. The memory slot connector 44 that retains the memory 81 is located separate from the inner surface of the housing 5, which suppresses the transfer of the heat of the memory slot connector 44 to the housing 5. The third chamber 63 is communicated with the outside through a ventilation port provided in the lower wall 7 of the housing 5. As illustrated in FIG. 4, the PCH 42, the memory 81, the ODD 32, and the storage device 33 are exposed in the third chamber 63. The PCH 42 and the memory 81 are not provided with a radiation member and are cooled by natural heat release.

The first part 31c of the circuit board 31 is exposed to the second chamber 62. The second part 31d of the circuit board 31 is exposed to the third chamber 63. In the housing 5, the components of the first embodiment partition the third chamber 63 not completely but partially. Incidentally, the third chamber 63 may completely be partitioned.

The operation of the electronic device 1 will be described below with reference to FIGS. 13 to 15 which schematically illustrate the structure of the first embodiment.

Figure 13:
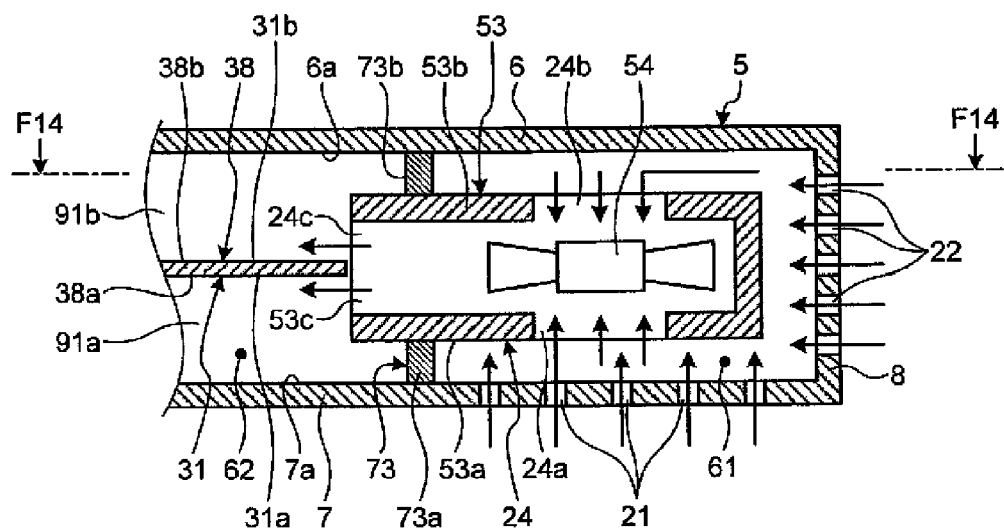
FIG. 13 is an exemplary cross-sectional view schematically illustrating the inside of the electronic device of FIG. 8 in the first embodiment.

As illustrated in FIGS. 13 and 14, the housing 5 is divided into the first chamber 61 and the second chamber 62. A structure (third wall portion 73) that cuts off the flow of the air is provided between the first chamber 61 and the second chamber 62. The first suction port 24a and the second suction port 24b of the cooling fan 24 are exposed to the first chamber 61. The ejection port 24c of the cooling fan 24 is exposed to the second chamber 62. That is, a partial sealing region in which the suction ports 24a and 24b of the cooling fan 24 are blocked is provided in the corner of the housing 5.

In the cooling fan 24, air is sucked from the outside of the housing 5 through the first chamber 61, and the air is ejected from the first chamber 61 to the second chamber 62. The suction port of the cooling fan 24 is not exposed to the second chamber 62 and the third chamber 63. Therefore, the cooling fan 24 sucks very little or almost no air in the second chamber 62 and the third chamber 63, which are warmed by the heat generating elements such as the CPU 41, the PCH 42, and the power-circuit component 43.

The cooling fan 24 sucks low-temperature air from the outside of the housing 5 through the first chamber 61, and ejects the low-temperature air toward the CPU 41 in the second chamber 62. While, in the first embodiment, the air inlet ports are provided in the lower wall 7 and the peripheral wall 8 of the housing 5, it will suffice if an air inlet port is provided in at least one of the upper wall 6, the lower wall 7, and the peripheral wall 8 of the housing 5.

Figure 15:
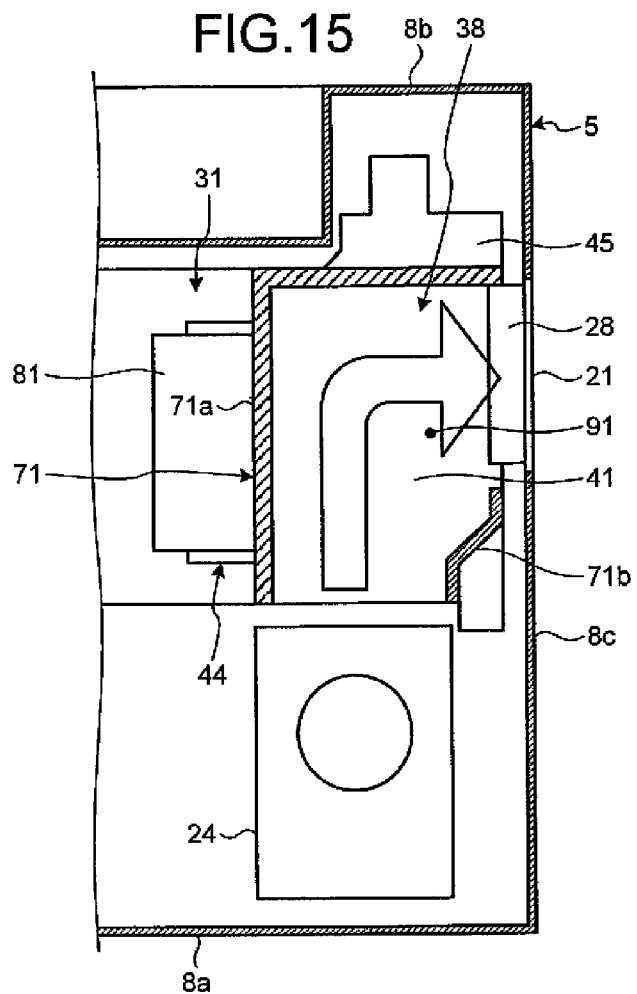
FIG. 15 is an exemplary cross-sectional view schematically illustrating a duct structure of the electronic device of FIG. 8 in the first embodiment.
Figure 16:
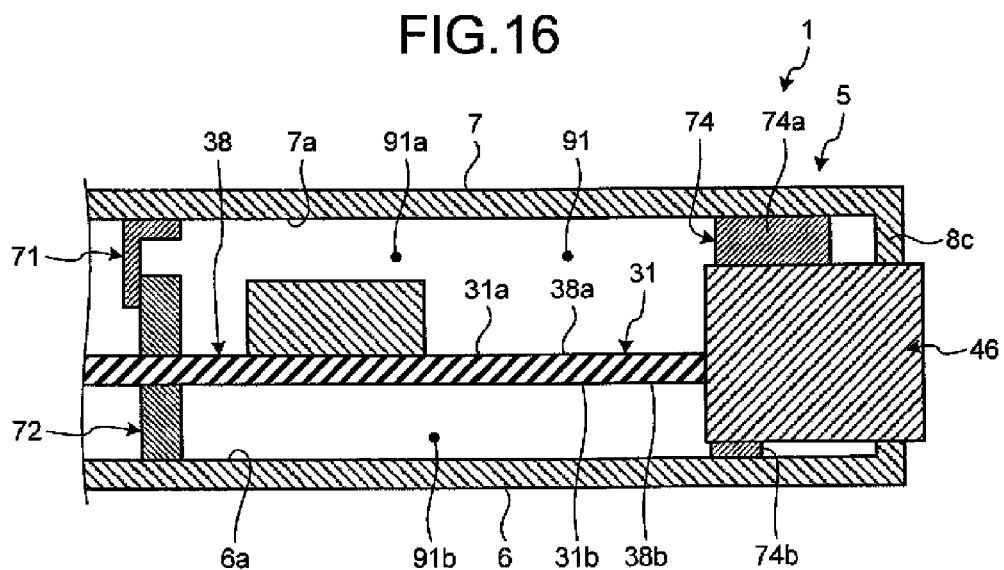
FIG. 16 is an exemplary cross-sectional view schematically illustrating the duct structure of the electronic device of FIG. 8 in the first embodiment.

As illustrated in FIGS. 15 and 16, the ventilation path 91 (the first ventilation path 91a and the second ventilation path 91b) that guides cooling wind from the cooling fan 24 toward the heat sink 28 is formed by board components mounted on the circuit board 31 in the housing 5. More specifically, the wall surfaces on both sides of the ventilation path 91 are formed by the first wall portion 71. That is, the space surrounded by the first wall portion 71, the circuit board device 38, and the lower wall 7 and the upper wall 6 of the housing 5 (or the keyboard 9) constitutes the ventilation path 91.

Therefore, the cooling wind ejected from the cooling fan 24 moves from the cooling fan 24 toward the heat sink 28 through the circuit board device 38 along an arrow in FIG. 15. That is, the cooling wind ejected from the cooling fan 24 flows reliably through the CPU 41 and the heat sink 28 in a concentrated manner without spreading widely in the housing 5, thereby efficiently cooling the CPU 41 and the heat sink 28.

This structure can improve the cooling efficiency.

For example, a structure in which the suction port in the upper surface of the cooling fan has an opening in the housing while the suction port in the lower surface of the cooling fan faces the air inlet port in the lower wall of the housing is taken as an example of the air inlet structure. In this case, the suction port in the upper surface of the cooling fan sucks warmed air in the housing 5 while the suction port in the lower surface can take in low-temperature external air. Therefore, air ejected from the cooling fan 24 has a certain temperature and cannot efficiently cool the heat sink 28 exposed to the air.

On the other hand, in the structure of the first embodiment, the wind shield portion 64 is provided between the suction ports 24a and 24b and the ejection port 24c of the cooling fan 24 to at least partially partition the space inside the housing 5. Therefore, the air that is ejected from the ejection port 24c and warmed by the CPU 41 and the heat sink 28 is hardly sucked again from the suction ports 24a and 24b. Thus, the relatively-low-temperature air can be sent to the CPU 41 and the heat sink 28 to achieve the improvement of the radiation efficiency.

In the first embodiment, the wind shield portion 64 is provided in the housing 5 to at least partially partition the first chamber 61 to which the air inlet ports 21, 22, and 23 of the housing 5 and the suction ports 24a and 24b of the cooling fan 24 are exposed and the second chamber 62 to which the exhaust ports 26 and 27 of the housing 5, the CPU 41, the heat sink 28, the heat pipe 34, and the ejection port 24c of the cooling fan 24 are exposed. Thus, air warmed by the CPU 41, the heat sink 28, and the heat pipe 34 is hardly refluxed to the suction ports 24a and 24b of the cooling fan 24.

More specifically, in the first embodiment, the first chamber 61 is provided to take surrounding external air in the housing 5, and both the first suction port 24a in the lower surface 53a of the cooling fan 24 and the second suction port 24b in the upper surface 53b are exposed to the first chamber 61. On the other hand, heat generating elements such as the CPU 41 are housed in the second chamber 62 that is partitioned from the first chamber 61. With this structure, in addition to the first suction port 24a in the lower surface 53a of the cooling fan 24, the second suction port 24b in the upper surface 53b of the cooling fan 24 can also suck not warmed air in the housing 5 but low-temperature external air.

Thus, the lower-temperature air can be sent to the CPU 41 and the heat sink 28 to achieve the further improvement of the radiation efficiency. In other words, a structure in which the cooling fan 24 incorporated in the housing 5 sucks air 100% from the outside as much as possible to exhaust (send) the air 100% to the inside of the housing 5 is provided irrespective of the type of the cooling fan.

The cooling fan 24 is a relatively tall (thick) component in the components housed in the housing 5. If the cooling fan 24 is located below the palm rest 18, the cooling fan 24 can be housed by utilizing the space below the palm rest 18, where there is a margin with respect to the thickness of the housing 5 compared to the space below the keyboard placing portion 17. Thus, the housing 5 can be thinner.

At this point, for example, the structure in which the suction port in the upper surface of the cooling fan has an opening in the housing while the suction port in the lower surface faces the air inlet port in the lower wall of the housing is taken again as an example of the air inlet structure. In this case, when the air inlet port in the lower wall of the housing is closed from any cause, the suction port in the lower surface of the cooling fan sucks warmed air in the housing. This possibly degrades the cooling efficiency.

On the other hand, in the first embodiment, the first chamber 61 for the air inlet is provided in the housing 5 and comprises the second air inlet port 22 in addition to the first air inlet port 21. In this structure, even if the first air inlet port 21 is closed, the first chamber 61 is communicated with the outside through the second air inlet port 22. The suction ports 24a and 24b of the cooling fan 24 are opened to the first chamber 61, and thereby low-temperature external air can be sucked from the first chamber 61. Thus, the cooling efficiency is hardly degraded even if the air inlet port of the housing 5 is partially closed.

More specifically, if the first air inlet port 21 is provided in the lower wall 7 of the housing 5 while the second air inlet port 22 is provided in the peripheral wall 8 of the housing 5, it is unlikely that the two air inlet ports 21 and 22 are closed at the same time, and the first chamber 61 is easily communicated with the outside.

The second heat generating elements, such as the PCH 42, which can be cooled by natural heat release is further provided, and the wind shield portion 64 at least partially partitions the third chamber 63 including the second heat generating elements from the first chamber 61 and the second chamber 62 in the housing 5. With this, the cooling wind of the cooling fan 24 can be concentrated in the second chamber 62 while air warmed in the third chamber 63 is hardly sucked by the cooling fan 24. Thus, the cooling efficiency can be improved for the entire device.

In the first embodiment, as illustrated in FIG. 8, the CPU 41 is located at the outer peripheral portion of the L-shaped first ventilation path 91a in the second chamber 62. When viewed from the side of the ejection port 24c, the impeller 54 of the cooling fan 24 is rotated in the direction (indicated by arrow X of FIG. 8) from the outer peripheral portion of the first ventilation path 91a to the inner peripheral portion such that high-speed cooling wind reaches the CPU 41. Thus, the cooling effect on the CPU 41 is increased.

In the first embodiment, as illustrated in FIG. 8, the heat pipe 34 is curved into a shape such that it is brought close to the cooling fan 24 on the way from the CPU 41 to the heat sink 28, and is connected to the end of the heat sink 28 on the side of the cooling fan 24. With this, the heat pipe 34 can efficiently be exposed to cooling wind. Alternatively, the heat pipe 34 may be formed into a shape such that it is separated from the cooling fan 24 from the CPU 41 toward the heat sink 28. FIG. 8 also illustrates an example of such a shape. In this case, a large amount of cooling wind can be sent to the heat sink 28.

In the first embodiment, the first wall portion 71 and the second wall portion 72 are located in the housing 5 with the circuit board device 38 therebetween. The first wall portion 71 and the second wall portion 72 are equivalent to a pair of wall portions that guide the cooling wind. The first wall portion 71 comprises the second portion 71b that is an elastic portion abutting on the circuit board device 38 and the first portion 71a as a support portion attached to the inner surface of the housing 5 to support the second portion 71b. The first wall portion 71 is provided between the inner surface of the housing 5 and the circuit board device 38 with an elastic deformation of the second portion 71b. The first wall portion 71 is equivalent to a wall portion that guides cooling wind.

In other words, the circuit board device 38 includes a board, a circuit board, a circuit plate, a wiring plate on which components are mounted, a housing component, or a module. In other words, the first member 71c is part of the wind introducing member, a support member, a wall, a rib, a protrusion, a projection, or a retention portion. The ventilation path 91 (first ventilation path 91a and second ventilation path 92a) is a wind introducing path, a region, a first region, a portion surrounded by the board, the inside wall of the housing 5, and the wind introducing member (first wall portion 71, second wall portion 72, third wall portion 73, and fourth wall portion 74), or a portion between the cooling fan 24 and the exhaust ports 26 and 27. The wind introducing member (first wall portion 71, second wall portion 72, third wall portion 73, and fourth wall portion 74) is a wall, a rib, a protrusion, a projection, a retention portion, part of the wind introducing member, or a deformable member or material having flexibility or elasticity. The second member 71d in the wind introducing member is made of a material having a rigidity lower than that of the first member 71c. The top, bottom, left, and right described above can be reworded by "first", "second", "third", and "fourth". The "top and bottom" can be reworded by one and the other. The "left and right" can be reworded by one and the other.

In the first embodiment, the first wall portion 71 constituting the first ventilation path 91a and the second wall portion 72 constituting the second ventilation path 91b are arranged overlapping each other with the circuit board device 38 interposed therebetween. Accordingly, action of a shear force on the circuit board device 38 is suppressed between the first wall portion 71 and the second wall portion 72. Thus, according to the first embodiment, it is possible to suppress an increase in load on the circuit board 31 as well as to improve the cooling efficiency by the cooling fan 24. The shear force acts on the circuit board device 38 if the first wall portion 71 and the second wall portion 72 are arranged not overlapping each other but shifted from each other.

In the first embodiment, the first wall portion 71 comprises the first member 71c provided in the inner surface of the housing 5 and the second member 71d, which is attached to the first member 71c to abut on the circuit board device 38 and has a rigidity lower than that of the first member 71c. The first wall portion 71 is provided between the inner surface of the housing 5 and the circuit board device 38. Accordingly, the second member 71d is strongly supported by the first member 71c while the load on the circuit board device 38 is suppressed by the second member 71d. With this, the second member 71d can be prevented from falling over due to cooling wind. Thus, according to the first embodiment, it is possible to suppress an increase in load on the circuit board 31 as well as to improve the cooling efficiency by the cooling fan 24.

Modifications of the first embodiment will be described below. Elements corresponding to those of the first embodiment will be designated by the same reference numerals, and their description will not be repeated. The modifications are of the same structure as the first embodiment except those described below.

Figure 17:
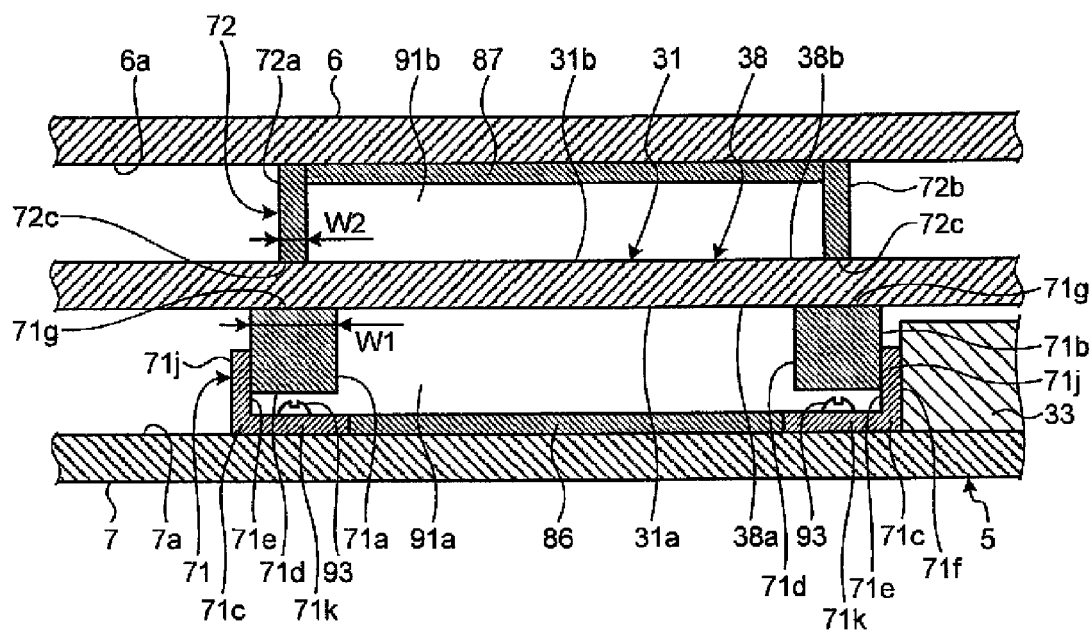
FIG. 17 is an exemplary cross-sectional view illustrating a duct structure according to a first modification of the first embodiment.

A first modification will be described with reference to FIG. 17. In the first modification, one of the first width W1 of the first abutment surface 71g in a direction (the horizontal direction in FIG. 17) perpendicular to a direction in which the first abutment surface 71g of the first wall portion 71 extends and the second width W2 of the second abutment surface 72c in a direction (the horizontal direction in FIG. 17) perpendicular to a direction in which the second abutment surface 72c of the second wall portion 72 extends is larger than the other. In the first modification, the first width W1 of the first abutment surface 71g is larger than the second width W2 of the second abutment surface 72c. With this, even if there is a difference in shape between the second wall portion 72 and the first wall portion 71, the difference is absorbed, and the second wall portion 72 and the first wall portion 71 can be arranged overlapping each other.

The first member 71c of the second portion 71b of the first wall portion 71 constitutes a support wall of the storage device 33 to support the storage device 33. The first member 71c constitutes a positioning wall of the storage device 33 to position the storage device 33. The storage device 33 is an example of a component or a module which is supported and positioned by the first member 71c.

A first insulator 86 as a plate-like member and a second insulator 87 as a plate-like member are provided in the first modification. The first insulator 86 and the second insulator 87 are plate-like members having an insulation property. The first insulator 86 and the second insulator 87 also have a heat shield property and a sound insulating property. The first insulator 86 adheres to the inner surface 7a of the lower wall 7 between the first portion 71a and the second portion 71b of the first wall portion 71 by a double-sided adhesive tape. The second insulator 87 adheres to the inner surface 6a of the upper wall 6 between the first portion 72a and the second portion 72b of the second wall portion 72 by a double-sided adhesive tape.

In the first modification, the first member 71c of the first wall portion 71 is fixed to the inner surface 7a of the lower wall 7 by screws 93. More specifically, the first wall 71k of the first member 71c is fixed to the inner surface 7a of the lower wall 7 by the screws 93. That is, the first member 71c is screwed to the lower wall 7. In this manner, the first member 71c can strongly be fixed to the lower wall 7 by fixing the first member 71c to the lower wall 7 with the screws 93. In the example of FIG. 17, after the first member 71c is fixed to the lower wall 7 by the screws 93, the second member 71d is attached to the first member 71c by a double-sided adhesive tape, which allows the first member 71c to be easily fixed to the lower wall 7.

Figure 18:
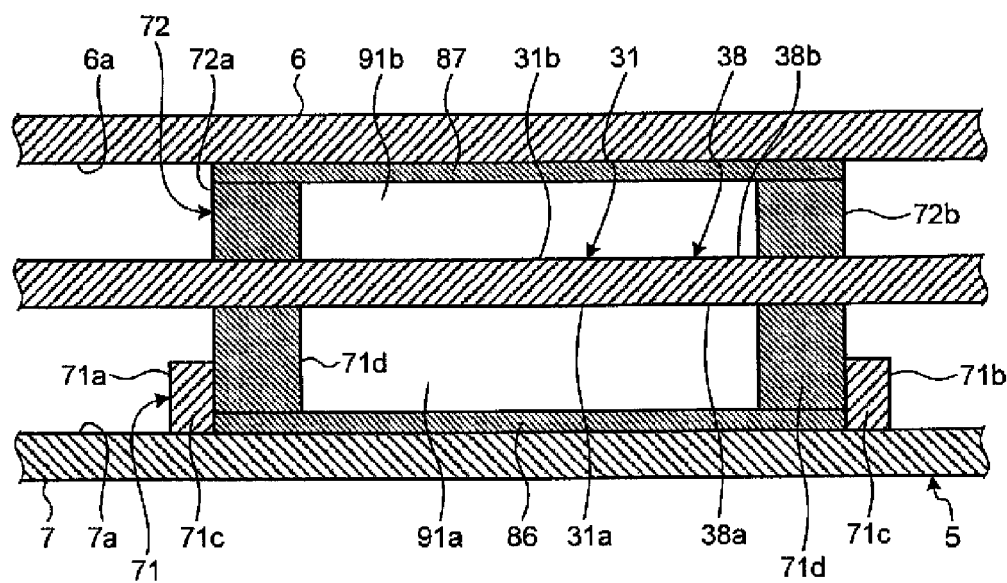
FIG. 18 is an exemplary cross-sectional view illustrating a duct structure according to a second modification of the first embodiment.

A second modification will be described with reference to FIG. 18. In the second modification, the first insulator 86 is located between the second member 71d of the first wall portion 71 and the inner surface 7a of the lower wall 7. That is, the first insulator 86 as a plate-like member is attached to the inner surface of the housing 5 while located between the inner surface of the housing 5 and the second member 71d. The second insulator 87 is located between the second wall portion 72 and the inner surface 6a of the upper wall 6. That is, the second wall portion 72 is attached to the housing 5 with the second insulator 87 interposed therebetween.

Figure 19A:
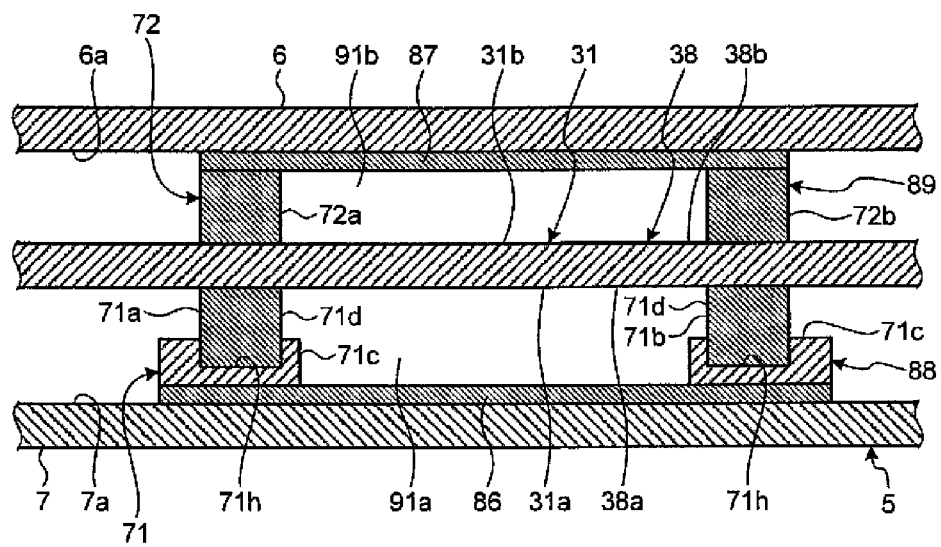
FIG. 19A is an exemplary cross-sectional view illustrating a duct structure according to a third modification of the first embodiment.
Figure 19B:
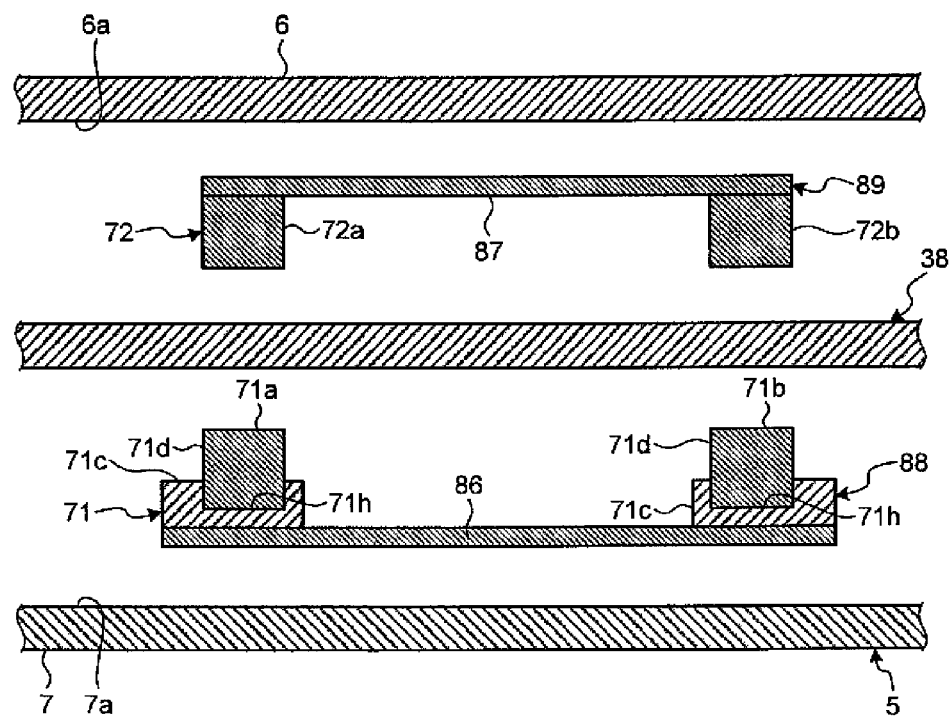
FIG. 19B is an exemplary exploded sectional view illustrating the duct structure of the third modification.

A third modification will be described with reference to FIGS. 19A and 19B. In the third modification, the first insulator 86 is previously attached to the first wall portion 71 to constitute a wall unit 88. The first insulator 86 is attached to the first member 71c by, for example, a double-sided adhesive tape. The first insulator 86 is attached to the housing 5 by, for example, a double-sided adhesive tape. Accordingly, in the third modification, a wall unit 88 comprises the first insulator 86 as a plate-like member attached to the first wall portion 71 and the first member 71c, and the first insulator 86 is attached to the inner surface of the housing 5.

The second insulator 87 is previously attached to the second wall portion 72 to constitute a wall unit 89. The second insulator 87 is attached to the second wall portion 72 by, for example, a double-sided adhesive tape. The second insulator 87 is attached to the housing 5 by, for example, a double-sided adhesive tape. Accordingly, in the third modification, the wall unit 89 comprises the second insulator 87 as a plate-like member attached to the second wall portion 72, and the second insulator 87 is attached to the inner surface of the housing 5.

With this structure, the first wall portion 71 and the second wall portion 72 can easily be attached to the housing 5.

An insertion portion 71h in which the second member 71d is inserted is provided in the first member 71c of the first wall portion 71. The insertion portion 71h is formed in a groove shape. With this, the second member 71d can easily attached to the first member 71c, and the second member 71d can more strongly be supported by the first member 71c.

Figure 20:
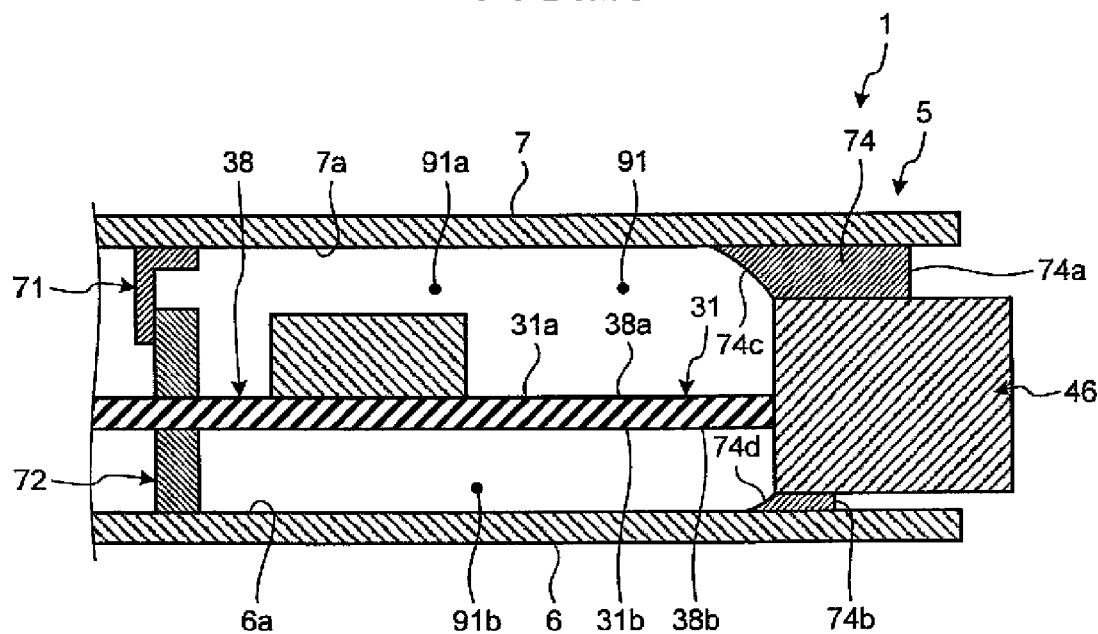
FIG. 20 is an exemplary sectional view illustrating a duct structure according to a fourth modification of the first embodiment.

A fourth modification will be described with reference to FIG. 20. In the fourth modification, the first portion 74a and the second portion 74b of the fourth wall portion 74 comprise overhang portions 74c and 74d extending from the heat sink 28 toward the circuit board 31, respectively. The overhang portions 74c and 74d are each formed in a tapered and curved shape such that the thicknesses decreases in the extending direction. With this, the resistance of the fourth wall portion 74 against cooling wind can be decreased to efficiently guide faster cooling wind to the heat sink 28.

Figure 21:
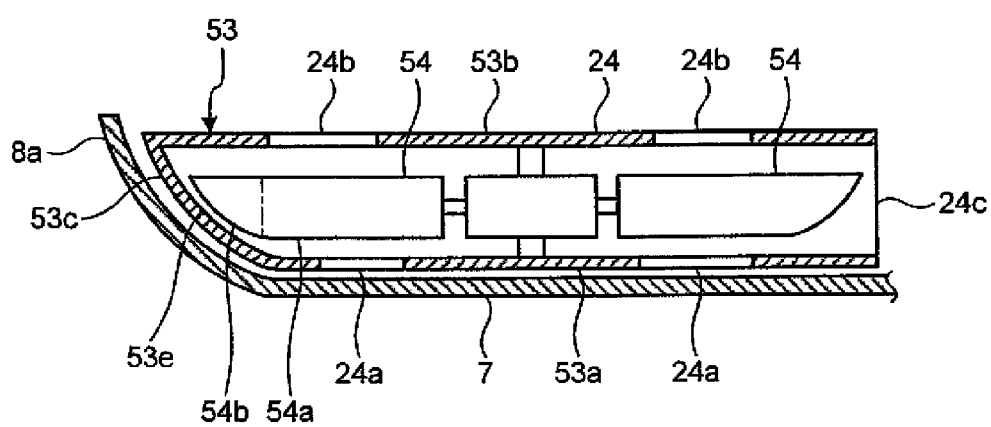
FIG. 21 is an exemplary cross-sectional view illustrating a fan according to a fifth modification of the first embodiment.

A fifth modification will be described with reference to FIG. 21. In the fifth modification, the fan case 53 of the cooling fan 24 is curved along the front wall 8a of the housing 5, and the impeller 54 is also curved along the front wall 8a. More specifically, the fan case 53 comprises a curved portion 53e in the peripheral wall 53c, and the curved portion 53e is curved along the front wall 8a. The impeller 54 comprises a rectangular base 54a and an extended portion 54b that extends from the base 54a toward the peripheral wall $53c_o$. The extended portion 54b is curved along the curvature of the front wall 8a such that the thickness of the extended portion 54b decreases toward the leading end.

In this structure, the extended portion 54b is curved and extended along the curvature of the front wall 8a. Thus, an air volume by the impeller 54 can be increased by the extended portion 54b.

Figure 22:
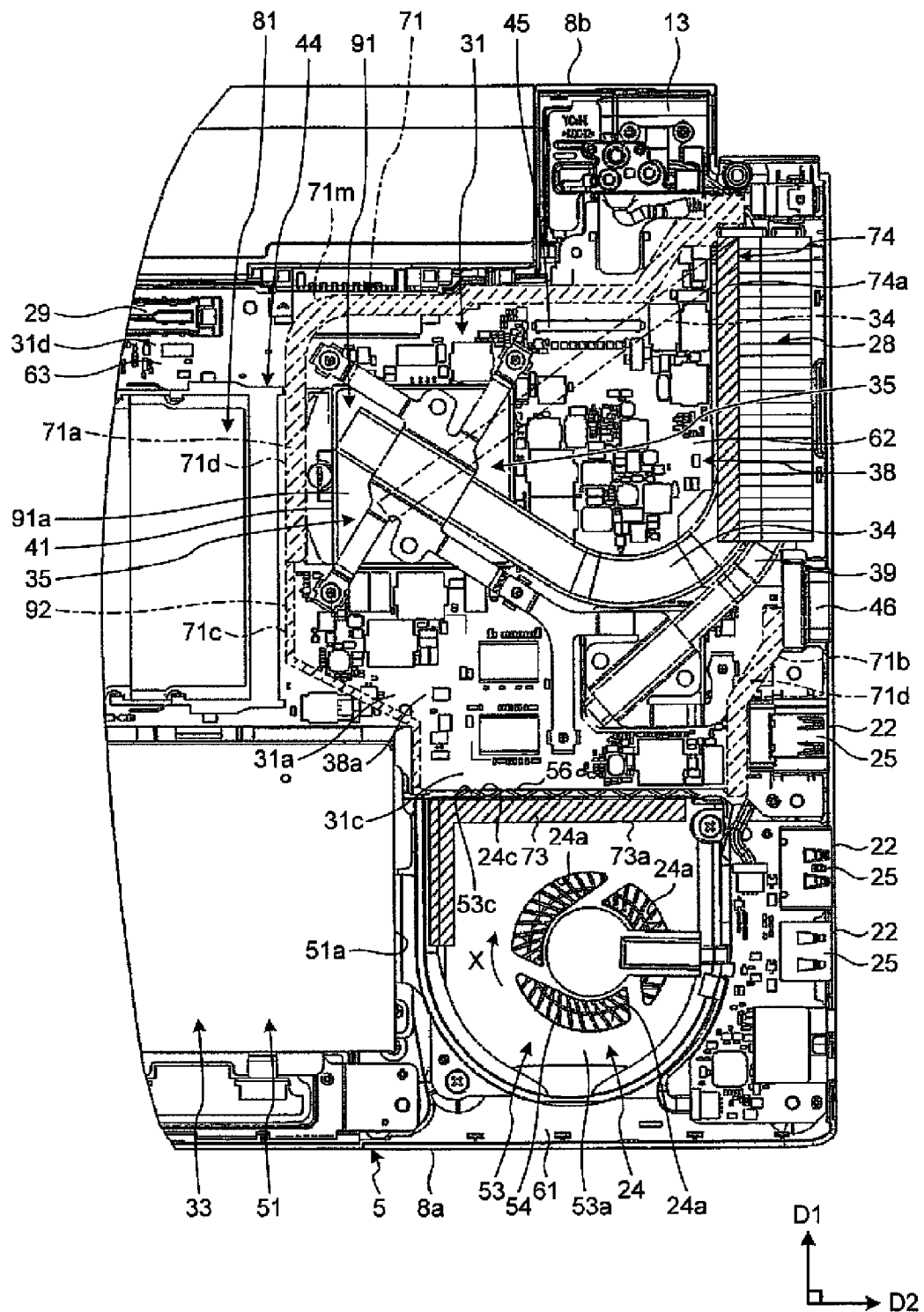
FIG. 22 is an exemplary plan view illustrating an inside of an electronic device according to a sixth modification of the first embodiment.

A sixth modification will be described with reference to FIG. 22. In the sixth modification, curved portions 71m are formed in the corners of the L-shaped ventilation paths 91 in the first wall portion 71 and the second wall portion 72 (not illustrated in FIG. 22). With this, the resistance against cooling wind flowing through the ventilation path 91 can be reduced.

Figure 23:
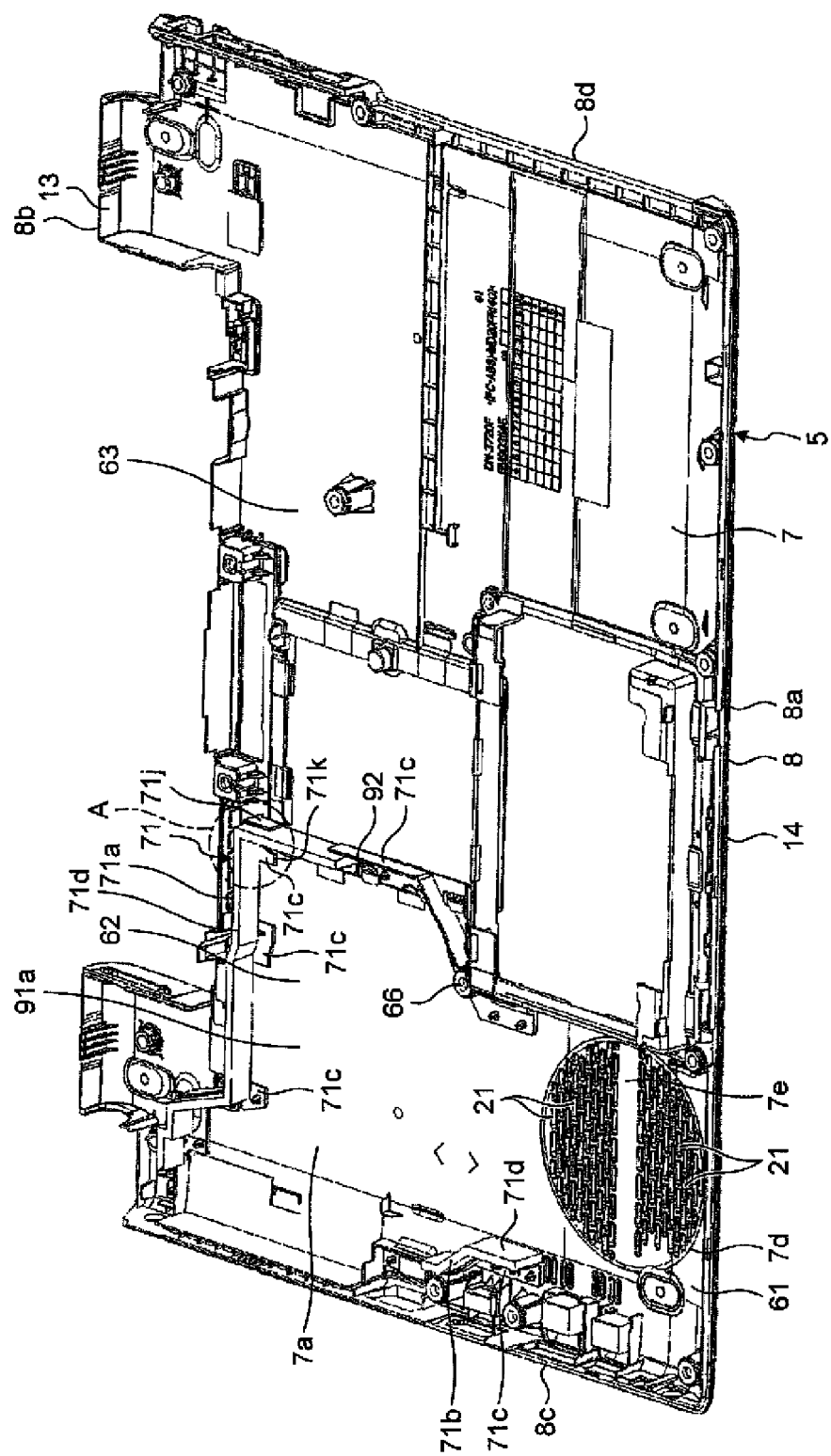
FIG. 23 is an exemplary perspective view illustrating an inside of a lower wall of an electronic device according to a seventh modification of the first embodiment.
Figure 24:
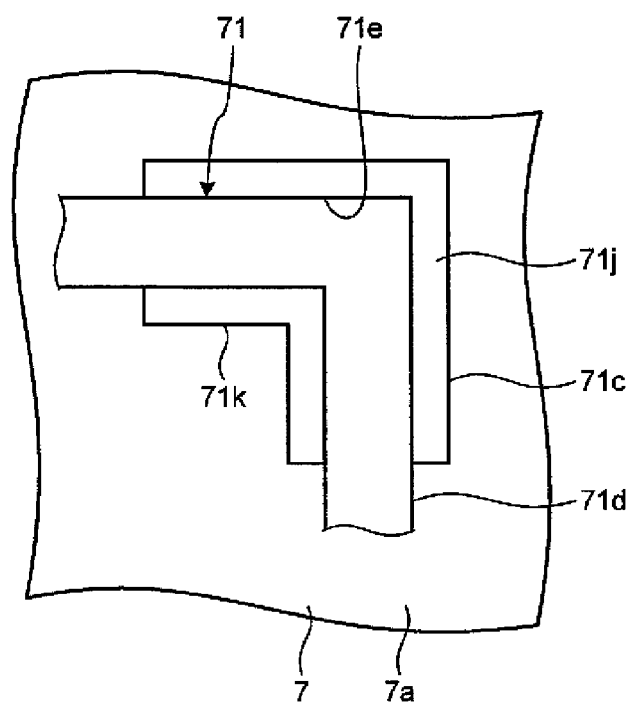
FIG. 24 is an exemplary plan view schematically illustrating a region A of FIG. 23 in the seventh modification.

A seventh modification will be described with reference to FIGS. 23 and 24. As illustrated in FIG. 23, in the seventh modification, a plurality of first members 71c are provided in the first portion 71a of the first wall portion 71 while separated from one another. In other words, the first portion 71a is provided as being divided. The first member 71c is partially provided in the corner (i.e., a corner portion or a bent portion) of the first wall portion 71. The first member 71c is provided at the end of the first wall portion 71 in the extended direction. The first members 71c are coupled by the second member 71d. The second member 71d connects between the first members 71c. As illustrated in FIG. 24, the extended direction along the inner surface 7a of the lower wall 7 is bent in one of the first members 71c, and the second member 71d is located on the inner peripheral side, in particular, on the inner peripheral side of the second wall 71j. In the first members 71c, the second member 71d may be located on the outer peripheral side, in particular, on the outer peripheral side of the second wall 71j. While the seventh modification is described by way of example as being applied to the first portion 71a comprising the L-shaped portion of FIG. 9, it may be applied to the first portion 71a having the vertical wall shape of FIG. 18 or the first portion 71a comprising the recessed insertion portion 71h of FIG. 19A. That is, the first member 71c may be present on one side or on both sides in the width direction of the second member 71d.

In this manner, the first members 71c are provided separate from one another in the corners of the first wall portion 71. Thus, the second member 71d can well be supported while the weight of the first wall portion 71 is reduced.

Figure 25:
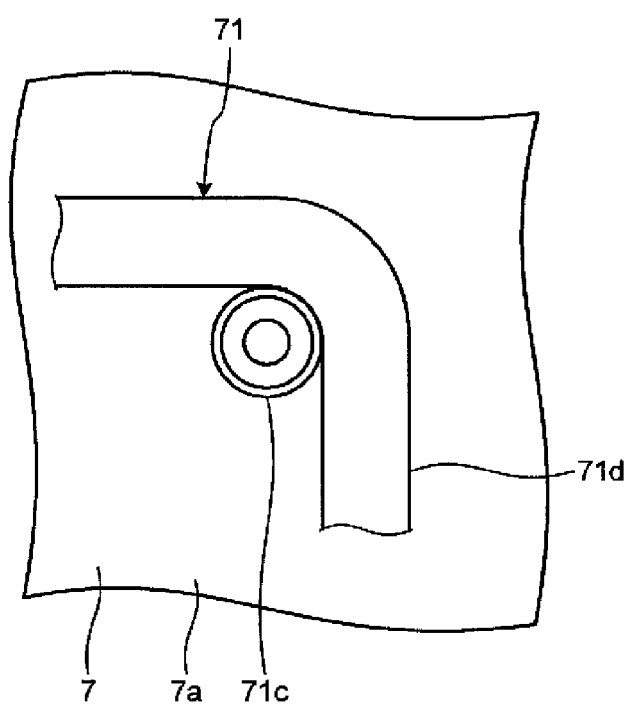
FIG. 25 is an exemplary plan view illustrating an inside of an electronic device according to an eighth modification of the first embodiment.

An eighth modification will be described with reference to FIG. 25. A portion illustrated in FIG. 25 is equivalent to that of FIG. 24 in the electronic device 1. The first wall portion 71 of the eighth modification is basically the same as previously described in the seventh modification except that one of the first portions 71a includes a third projection (hereinafter designated by numeral 71a). The third projection 71a as the first portion is provided in the inner surface 7a of the lower wall 7. For example, the third projection 71a is a boss that supports a component such as the circuit board 31 in the housing 5. In this manner, in the eighth modification, the third projection 71a is substituted for the first portion. The second member 71d is curved along the outer periphery of the third projection 71a. That is, the third projection 71a is located on the inner peripheral side of the corner of the second member 71d. In other words, the third projection 71a is located at an internal angle of the second member 71d. In other words, the projection is a protrusion or a protruding portion.

As described above, the third projection 71a is located on the inner peripheral side of the corner of the second member 71d. Thus, the second member 71d can be attached to the third projection 71a by adhesion while entrained about the third projection 71a. This facilitates the attachment of the second member 71d. In this case, since the second member 71d is positioned as being hooked over the third projection 71a, it is not necessary to bond the third projection 71a and the second member 71d together.

Figure 26:
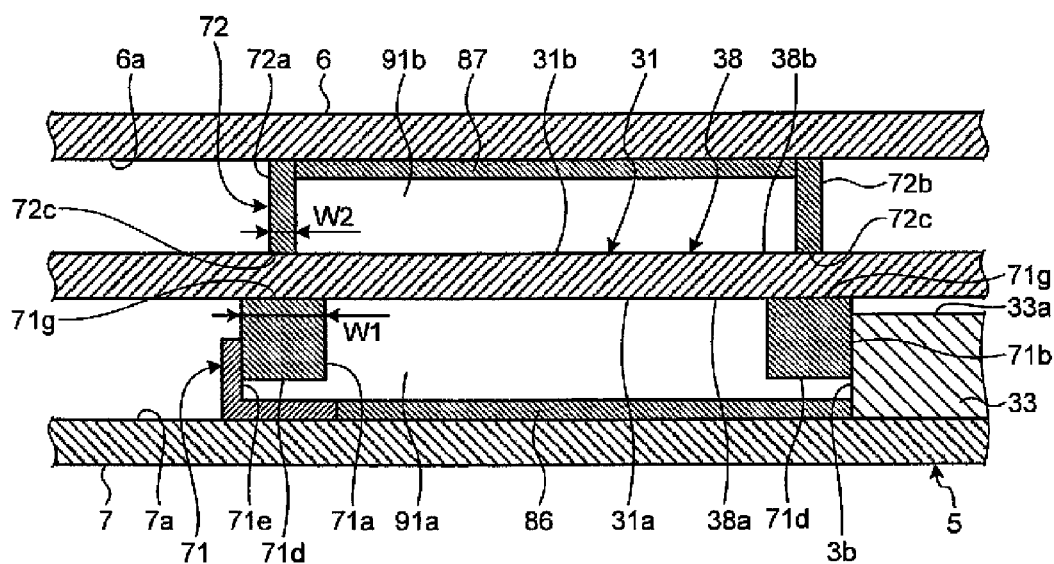
FIG. 26 is an exemplary cross-sectional view illustrating a duct structure according to a ninth modification of the first embodiment.

A ninth modification will be described with reference to FIG. 26. In the ninth modification, a case 33a of the storage device (for example, HDD) 33 serves as the first member of the second portion 72b of the first wall portion 71. That is, a side surface 3b of the case 33a of the storage device 33 supports the second member 71d of the second portion 72b. The second member 71d is attached to a side surface 3b of the case 33a by, for example, a double-sided adhesive tape. The storage device 33 is an example of a relatively tall component. The storage device 33 is an example of a module. That is, the second member 71d may be attached to not only the dedicated first member 71c but also another component. In other words, another component is used as the first member 71c as a double-use portion, i.e., another component is substituted for the first member 71c. The double-use portion has the first function as well as the second function of supporting the second member 71d. In the case 33a of the storage device 33, the first function is to store and protect a storage module of the storage device 33.

In this manner, the second member 71d as the double-use portion is attached to the case 33a of the storage device 33. Thus, the duct structure can be relatively simplified and thereby obtained at low cost. The use of the double-use portion is not limited to the storage device 33, but the double-use portion may be used in the fan case 53 or the ODD 32.

Figure 27:
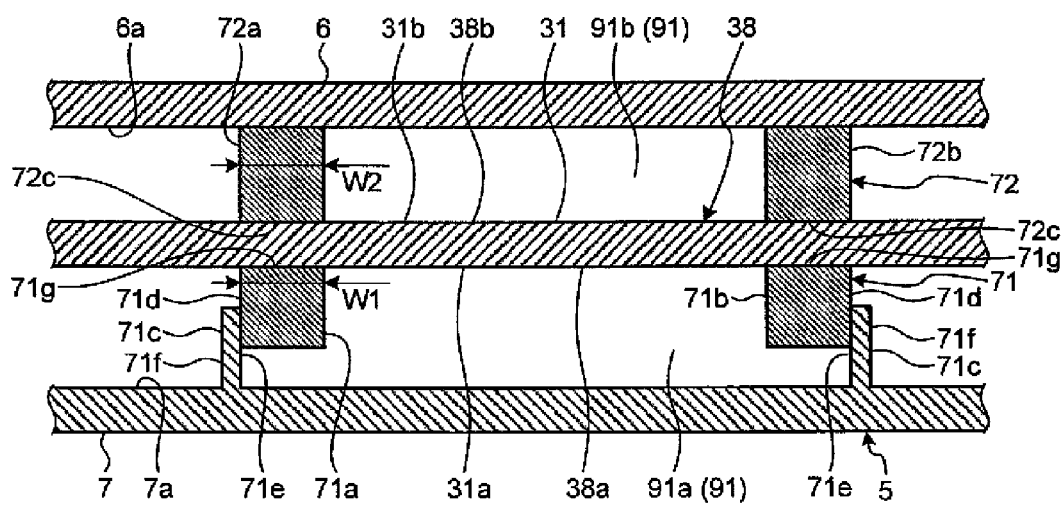
FIG. 27 is an exemplary cross-sectional view illustrating a duct structure according to a tenth modification of the first embodiment.

A tenth modification will be described with reference to FIG. 27. In the tenth modification, the first member 71c of the first wall portion 71 is integrally formed with the inner surface 7a of the lower wall 7 as the inner surface of the housing 5. For example, the first member 71c is a rib (protrusion or projection) projected from the inner surface 7a of the lower wall 7. The housing 5 and the first member 71c are a resin integrated molding product. In this manner, the first member 71c is integrally formed with the inner surface 7a of the lower wall 7, which further enhances the rigidity of the housing 5. Besides, there is no need of attaching the first member 71c to the inner surface 7a of the lower wall 7, which reduces burden on the operator.

A display device 111 according to a second embodiment will be described below with reference to FIG. 28. Elements corresponding to those of the first embodiment will be designated by the same reference numerals, and their description will not be repeated. The second embodiment is of the same structure as the first embodiment except those described below.

Figure 28:
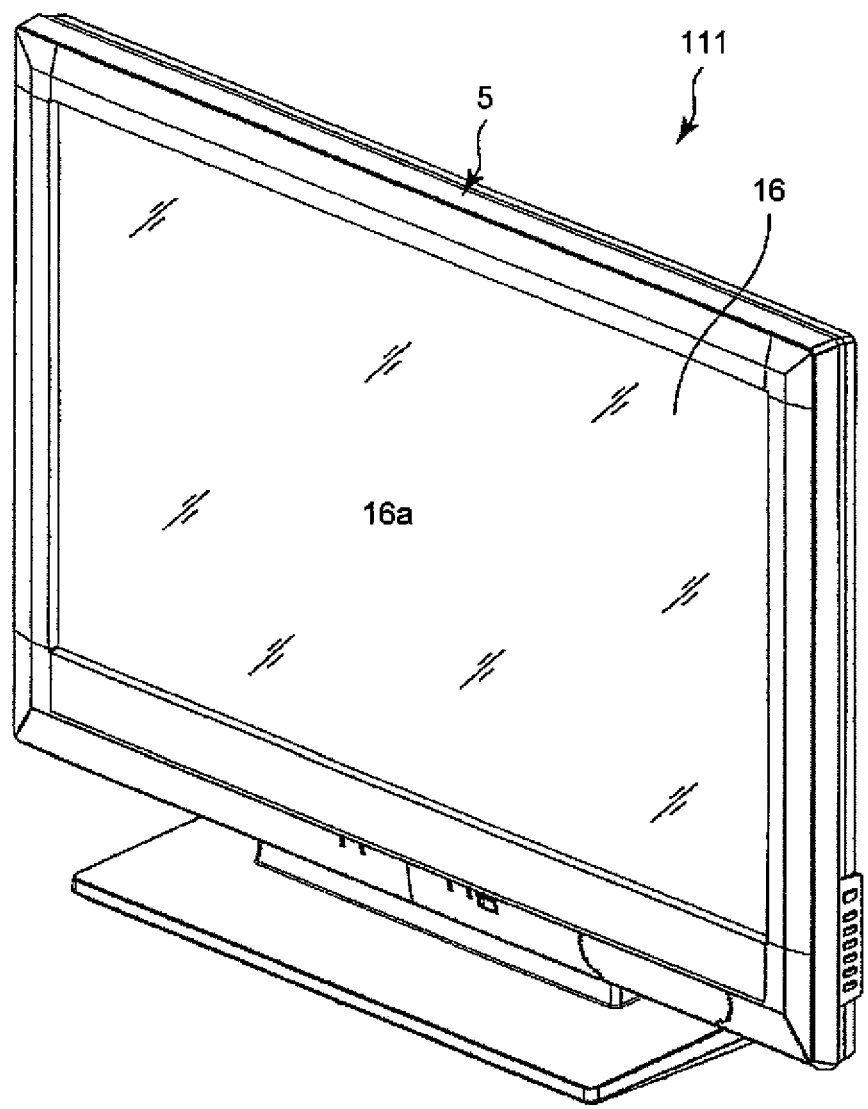
FIG. 28 is an exemplary perspective view of a display device according to a second embodiment.

As illustrated in FIG. 28, the display device 111 comprises a housing 5 and a display panel 16 housed in the housing 5. The display device 111 may be, for example, a television. The housing 5 has the same structure as previously described in the first embodiment or the modifications thereof.

With the display device 111 having this structure, the cooling efficiency can be improved as in the first embodiment.

As described above, according to the first and second embodiments, it is possible to suppress an increase in load on the circuit board as well as to improve the cooling efficiency of the cooling fan.

Incidentally, for example, in the housing 5, it is not always necessary to partition the third chamber 63, but it is only necessary to partition the first chamber 61 and the second chamber 62. It is not always necessary to form the ventilation path 91. Instead of the wall portion, part (for example, rib) of the housing 5 may be used to partition the first chamber 61, the second chamber 62, and the third chamber 63. It is not always necessary that the first suction port 24a be oriented toward the air inlet port 21 of the lower wall 7. The first wall portion 71 and the second wall portion 72 may extend to the side of the cooling fan 24.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a housing comprising an exhaust port;
a circuit board device housed in the housing;
a fan comprising an ejection port, the fan in the housing, separated from the exhaust port, and configured to move air between the circuit board device and an inner surface of the housing, from the ejection port;
a wall portion between the inner surface of the housing and the circuit board device, configured to create a ventilation path from the ejection port to the exhaust port, the wall portion comprising:
a first member in the inner surface of the housing; and
a second member attached to the first member and abutting on the circuit board device, the second member having a rigidity lower than a rigidity of the first member; and
a wall unit comprising a third member attached to the first member and the wall portion, the third member being attached to the inner surface of the housing, wherein
the first member is attached to the inner surface of the housing by the member.

2. The display device of claim 1, wherein the second member comprises an elastic member.

3. The display device of claim 1, wherein the second member is attached to a side surface of the first member.

4. The display device of claim 3, wherein:
the first member comprises:
a first side surface that constitutes the ventilation path; and
a second side surface located opposite the first side surface, and
the second member is attached to the first side surface.

5. The display device of claim 1, wherein the third member is a plate like member.

6. The display device of claim 1, wherein the second member is separated from the inner surface of the housing.

7. The display device of claim 1, wherein the first member comprises an insertion portion into which the second member is inserted.

8. The display device of claim 1, further comprising a communication port between part of the wall portion and the inner surface of the housing, configured to communicate air between an inside and outside of the ventilation path in the housing.

9. The display device of claim 1, wherein
the circuit board device comprises a circuit board and an electronic component mounted on the circuit board, and
the second member abuts the electronic component.

10. The display device of claim 1, wherein:
the circuit board device comprises:
a circuit board comprising a first surface and a second surface opposite the first surface, and
a plurality of electronic components mounted to the first surface,
the member is configured to face the first surface,
the ventilation path is provided on a side of the first surface of the circuit board device and between the member and the circuit board, and
the second member abuts on the circuit board device via the electronic components.

11. The display device of claim 10, further comprising a second wall portion provided inside the housing, elastically abuts on the circuit board device, arranged so as to overlap the wall portion while interposing the circuit board device therebetween, and configured to create a second ventilation path from the ejection port to the exhaust port, the second ventilation path being provided on a side of the second surface of the circuit board device.

12. An electronic apparatus comprising:
a housing;
a circuit board device housed in the housing;
a fan configured to move air to the circuit board device; and
a wall portion comprising an elastic portion abutting the circuit board device, and a support portion attached to an inner surface of the housing, the support portion configured to support the elastic portion, the wall portion being sandwiched between an inner surface of the housing and the circuit board device with an elastic deformation of the elastic portion, the wall portion configured to guide the air.

* * * * *